(12) United States Patent
Little et al.

(10) Patent No.: US 9,472,910 B2
(45) Date of Patent: *Oct. 18, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Shuo-Hsiu Hsu, New Taipei (TW); Chih-Kai Yang, New Taipei (TW); An-Jen Yang, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/497,205

(22) Filed: Sep. 25, 2014

(65) Prior Publication Data
US 2015/0171573 A1 Jun. 18, 2015

Related U.S. Application Data

(63) Continuation-in-part of application No. 14/477,889, filed on Sep. 5, 2014, and a continuation-in-part of
(Continued)

(51) Int. Cl.
*H01R 24/00* (2011.01)
*H01R 24/60* (2011.01)
(Continued)

(52) U.S. Cl.
CPC .......... *H01R 24/60* (2013.01); *H01R 13/6658* (2013.01); *H01R 12/724* (2013.01);
(Continued)

(58) Field of Classification Search
CPC ...................... H01R 23/7023; H01R 23/7005

USPC .................. 439/660, 626, 374, 377, 79, 733
See application file for complete search history.

(56) References Cited

U.S. PATENT DOCUMENTS

| 5,073,130 | A | 12/1991 | Nakamura |
| 6,755,689 | B2 | 6/2004 | Zhang et al. |

(Continued)

FOREIGN PATENT DOCUMENTS

| CM | 201868687 U | 6/2011 |
| CN | 201029143 Y | 2/2008 |

(Continued)

OTHER PUBLICATIONS

USB Type-C Specification 0.9c05—May 18, 2014.
(Continued)

*Primary Examiner* — Phuongchi T Nguyen
(74) *Attorney, Agent, or Firm* — Wei Te Chung; Ming Chieh Chang

(57) ABSTRACT

An electrical connector assembly includes a receptacle connector and a flippable pug connector for connecting with a cable. The receptacle connector includes a terminal module assembly defining a mating tongue loading with two rows of contacts on opposing surface of the mating tongue and a metallic shell retained on the terminal module assembly and enclosing the mating tongue, thereby defining a mating cavity between the metallic shell and the mating tongue. The plug connector includes an insulating housing defining a center slot with side walls and two rows of contacts on the side walls and a metallic shell attached to an outer periphery of the insulating housing. The mating cavity of the receptacle connector is configured to be symmetrical to a horizontal center line without orientation limits so as to allow the plug connector to be mated in two opposite orientations, and the center slot receives the mating tongue.

17 Claims, 43 Drawing Sheets

Related U.S. Application Data application No. 14/337,180, filed on Jul. 21, 2014, and a continuation-in-part of application No. 14/454,737, filed on Aug. 8, 2014.

(60) Provisional application No. 61/916,147, filed on Dec. 14, 2013, provisional application No. 61/919,681, filed on Dec. 20, 2013, provisional application No. 61/926,270, filed on Jan. 11, 2014, provisional application No. 61/949,232, filed on Mar. 6, 2014, provisional application No. 61/917,363, filed on Dec. 18, 2013, provisional application No. 61/857,687, filed on Jul. 23, 2013, provisional application No. 61/856,077, filed on Jul. 19, 2013, provisional application No. 61/867,584, filed on Aug. 19, 2013, provisional application No. 61/866,037, filed on Aug. 14, 2013, provisional application No. 61/863,896, filed on Aug. 8, 2013, provisional application No. 61/875,096, filed on Sep. 8, 2013.

(51) Int. Cl.
*H01R 13/66* (2006.01)
*H01R 12/72* (2011.01)
*H01R 13/642* (2006.01)
*H01R 13/6582* (2011.01)
*H01R 24/28* (2011.01)
*H01R 107/00* (2006.01)
*H05K 1/11* (2006.01)
*H05K 1/18* (2006.01)

(52) U.S. Cl.
CPC ......... *H01R13/642* (2013.01); *H01R 13/6582* (2013.01); *H01R 24/28* (2013.01); *H01R 2107/00* (2013.01); *H05K 1/117* (2013.01); *H05K 1/184* (2013.01); *H05K 2201/10189* (2013.01)

(56) References Cited

U.S. PATENT DOCUMENTS

| | | | | |
|---|---|---|---|---|
| 6,916,198 B2 * | 7/2005 | Wu | ............... | H01R 13/6589 439/497 |
| 7,670,178 B2 * | 3/2010 | Gu | ............... | H01R 13/65802 439/607.01 |
| 7,758,379 B2 | 7/2010 | Chen | | |
| 8,087,944 B2 | 1/2012 | Kumamoto et al. | | |
| 8,517,773 B2 | 8/2013 | Lee et al. | | |
| 8,968,031 B2 | 3/2015 | Simmel et al. | | |
| 8,968,033 B2 * | 3/2015 | Little | ............... | H01R 13/6581 439/607.35 |
| 2010/0267261 A1 | 10/2010 | Lin | | |
| 2010/0297885 A1 * | 11/2010 | Cao | ............... | H01R 4/028 439/626 |
| 2013/0095702 A1 | 4/2013 | Golko et al. | | |
| 2014/0024257 A1 | 1/2014 | Castillo et al. | | |
| 2014/0206233 A1 * | 7/2014 | Kao | ............... | H01R 13/6471 439/607.28 |
| 2015/0162684 A1 | 6/2015 | Amini et al. | | |
| 2015/0171562 A1 | 6/2015 | Gao et al. | | |
| 2015/0214673 A1 | 7/2015 | Gao et al. | | |
| 2015/0214674 A1 | 7/2015 | Simmel et al. | | |
| 2015/0244098 A1 * | 8/2015 | Ma | ............... | H01R 24/60 439/660 |
| 2015/0295362 A1 | 10/2015 | Tziviskos et al. | | |
| 2015/0340813 A1 | 11/2015 | Ng et al. | | |
| 2015/0340815 A1 | 11/2015 | Gao et al. | | |
| 2015/0340825 A1 | 11/2015 | Ng et al. | | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 1.0 Aug. 11, 2014.
Universal Serial Bus Type-C Cable and Connector Specification Revision 0.7 Working Draft Jan. xx, 2014.

* cited by examiner

FLIPPABLE ELECTRICAL CONNECTOR

CROSS REFERENCE TO RELATED APPLICATIONS

This application is a continuation-in-part of Ser. No. 14/477,889 filed Sep. 5, 2014, a continuation-in-part of Ser. No. 14/454,737 filed Aug. 8, 2014, a continuation-in-part of Ser. No. 14/337,180 filed Jul. 21, 2014, and claims the benefit of, and priority to, U.S. Provisional Patent Application No. 61/916,147, filed Dec. 14, 2013, No. 61/919,681, filed Dec. 20, 2013, No. 61/926,270, filed Jan. 11, 2014, 61/917,363 filed Dec. 18, 2013, and 61/949,232 filed Mar. 6, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical plug connector and the complementary receptacle connector are desired.

SUMMARY OF THE INVENTION

Accordingly, the object of the present invention is to provide a first connector for mounted to a printed circuit board and a flippable second connector for connecting with a cable. The first connector comprises a terminal module assembly defining a mating tongue loading with two rows of contacts on opposing surface of the mating tongue and a metallic shell retained on the terminal module assembly and enclosing the mating tongue, thereby defining a mating cavity between the metallic shell and the mating tongue. The second connector comprises an insulating housing defining a center slot with side walls and two twos of contacts on the side walls; and a metallic shell attached to an outer periphery of the insulating housing. The mating cavity of the receptacle connector is configured to be symmetrical to a horizontal center line with orientation limits so as to allow the second connector to be mated in two opposite orientations, and the center slot is receiving with the mating tongue.

Other objects, advantages and novel features of the invention will become more apparent from the following detailed description when taken in conjunction with the accompanying drawings.

BRIEF DESCRIPTION OF THE DRAWINGS

FIG. 18 (A) is a front perspective view of another embodiment of the shell for use with the receptacle connector of FIG. 16;

DETAILED DESCRIPTION OF THE PREFERRED EMBODIMENT

Reference will now be made in detail to the preferred embodiment of the present invention.

Referring to FIGS. 1-11 showing a first embodiment of the present invention which includes a plug connector 200 connecting with a cable 27 and a receptacle connector 300 mounted upon a mother board. The plug connector 200 may be shaped to have 180 degree symmetry so that it can be inserted and operatively coupled to the receptacle connector 300 in either of two insertion orientations.

Figure 1:
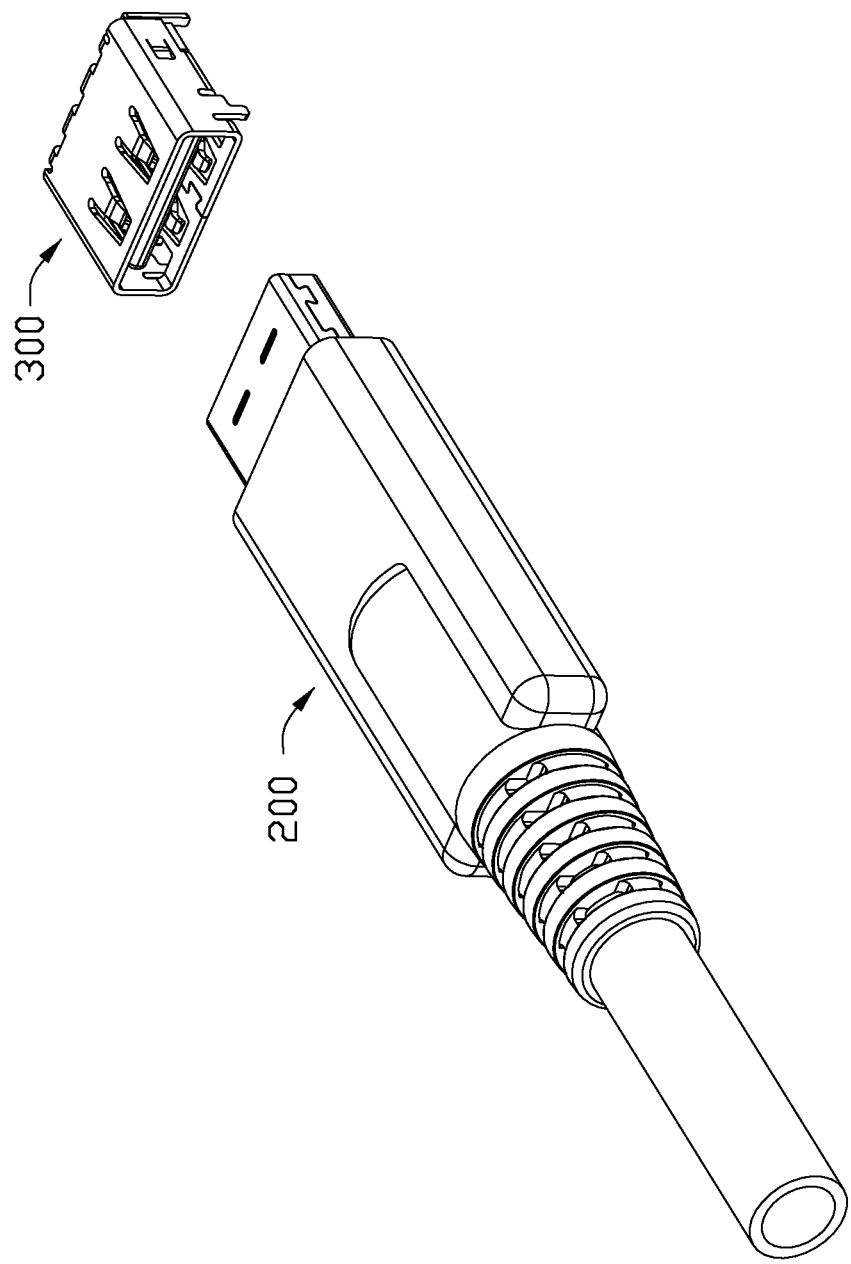
FIG. 1 is a rear perspective view of a plug connector and a corresponding receptacle connector according to a first embodiment of the present invention.
Figure 2:
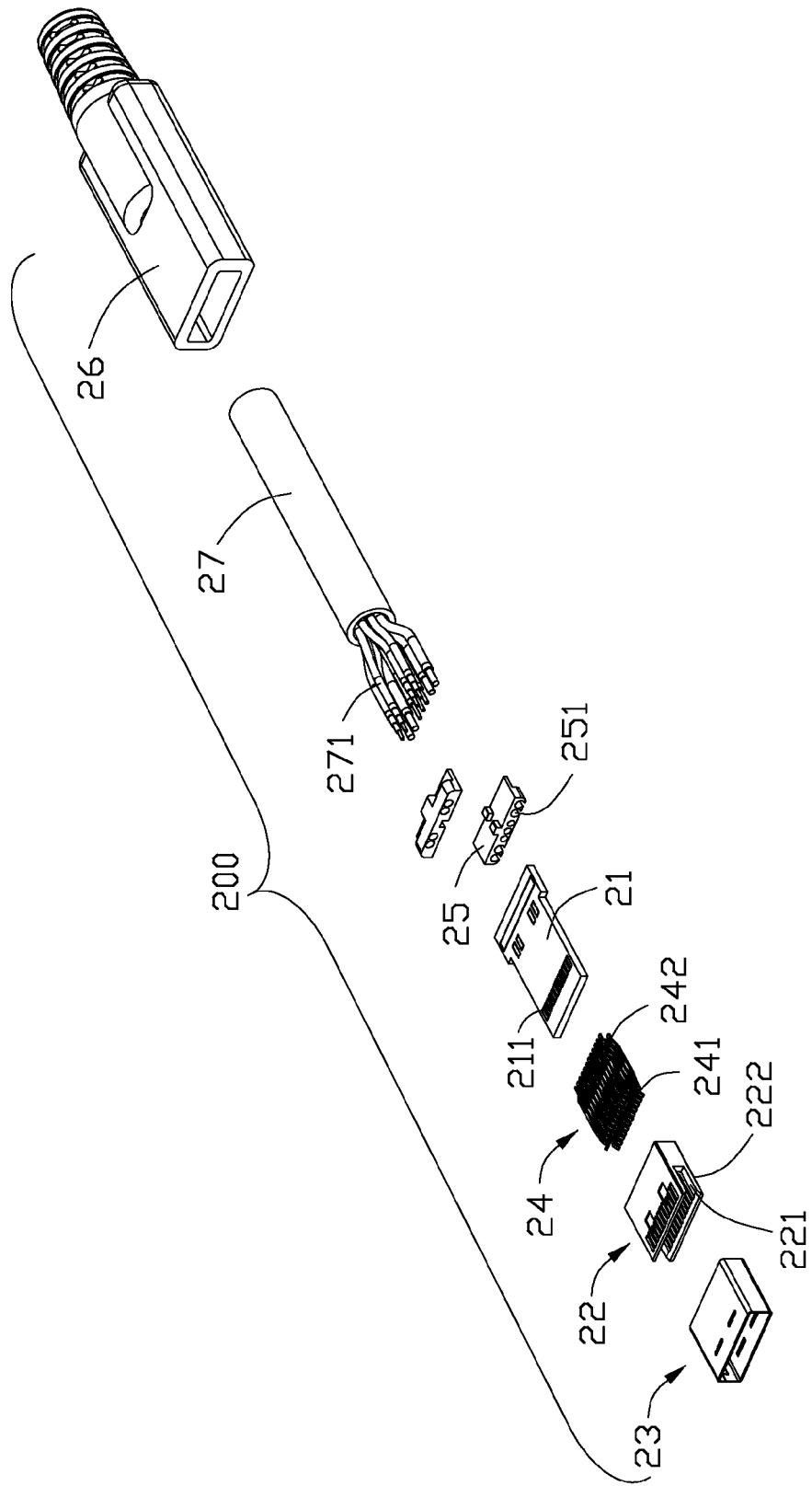
FIG. 2 is a front exploded perspective view of the plug connector of FIG. 1.
Figure 3:
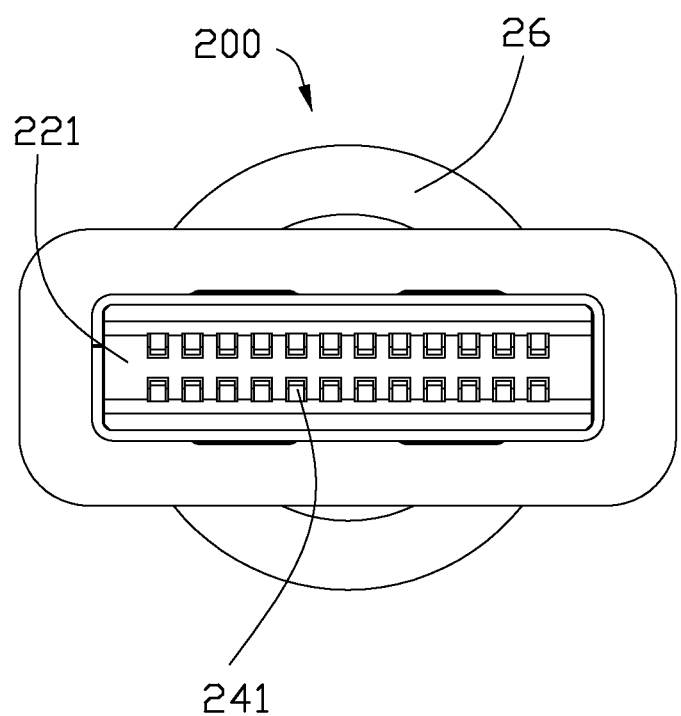
FIG. 3 is a front elevational view of plug connector of FIG. 1.
Figure 4:
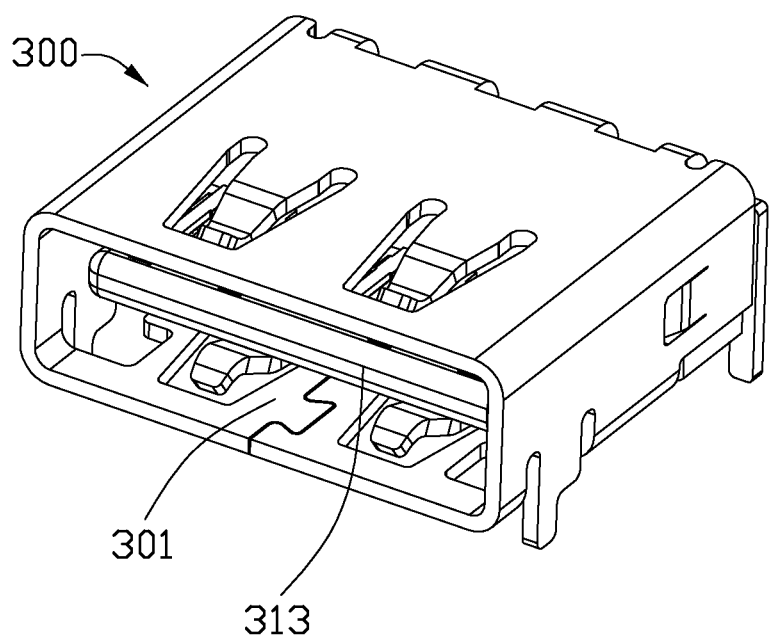
FIG. 4 is a front perspective view of the receptacle connector of FIG. 1.

Referring to FIGS. 1-3, the plug connector 200 including a paddle card 21 with circuit pads 211 on two opposite surfaces. An insulative housing 22 located in front of the paddle card 21, is enclosed in a metallic shell 23 and defines a center slot 221 between two sidewalls 222 each equipped with a plurality of contacts 24, each contact 24 having a front contacting section 241 extending into the center slot 221 and a rear mounting section 242 mechanically and electrically connected to a front region of the corresponding circuit pads 211, respectively. The cable 27 extends rearwardly from the paddle card 21 and includes therein a plurality of conductive wires 271 respectively connected to a rear region of the paddle card 21. A pair of spacers 25 is located behind the paddle card 21 and defines a plurality of through holes 251 into which the corresponding wires 271 extend, respectively. An insulating cover 26 is overmolded on the shell 23, the paddle card 21 and the cable 27 to finalize the whole plug connector 200.

Referring to FIGS. 4-11, the receptacle connector 300 includes a terminal module assembly 31 essentially composed of an upper terminal module 311 and a lower terminal module 312 commonly sandwiching a middle tongue 313 therebetween in a vertical direction. A plurality of upper contacts 321 are insert molded within the an upper insulator 331 to form the upper terminal module 311, a plurality of lower contacts 322 are insert molded within a lower insulator 332 to form the lower terminal module 312, and a shielding/grounding plate 34 is insert molded within a middle insulator 333 to form the middle tongue 313, wherein the upper contact 321 includes a front contacting section 3211 seated upon one surface of the middle tongue 313 and a rear mounting section 3212 mounted upon the corresponding circuit pad of the mother board (not shown), and the lower contact 322 includes a front contacting section 3221 seated upon the other surface of the middle tongue 313 and a rear mounting section 3222 mounted upon the corresponding circuit pad of the mother board (not shown).

Figure 7:
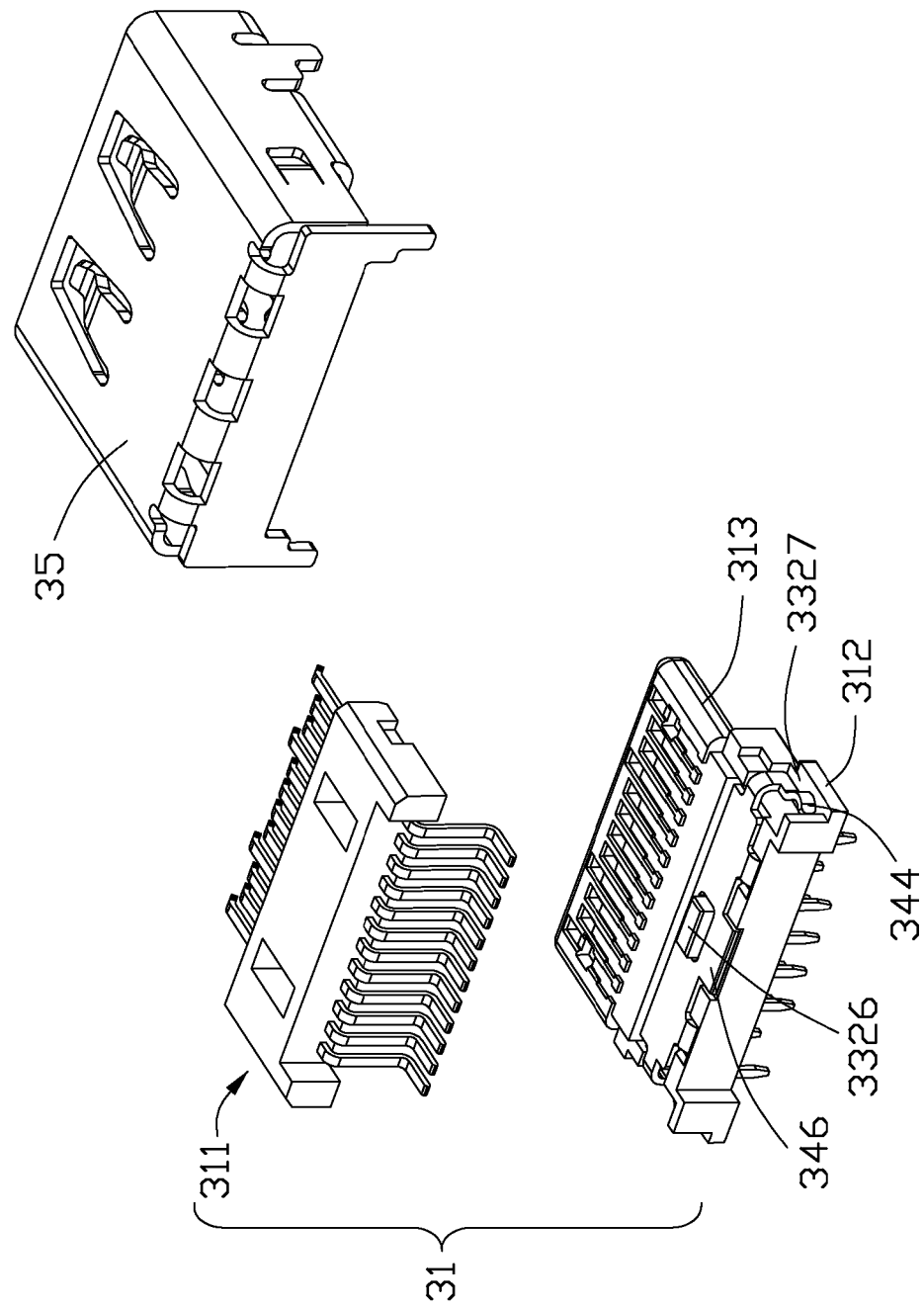
FIG. 7 is a rear perspective view of the receptacle connector with the partially assembled housing of the receptacle connector of FIG. 4.

The shielding/grounding plate 34 include a front region 340 embedded in the insulator 333 of the mating tongue 313 and a rear region 348 exposed behind the insulator 333 of the mating tongue 313. The rear region 348 defines an opening 345 in a middle portion along a transverse direction, a rearward extending rib 346 behind the opening 347, a pair of retaining ribs 343 located at sides of the extending rib 346 respectively and bending downwards and a pair of spring tab 344 with outward arc portions 3441 extending from two rear side edges thereof. The middle tongue 313 is assembled to the lower terminal module 312 in an upper-to-lower direction as best shown in FIG. 7, wherein the retaining rib 343 are inserted into and retained in corresponding holes 3325 (labeled in FIG. 6(A)) and the opening 345 is guided and retained with a post 3326, the extending rib 346 is received in a shallow recess defined on a top of the lower terminal module 312, and the spring tabs 344 are located at side recess 3327 defined on side of the insulators of the lower terminal module.

Figure 8:
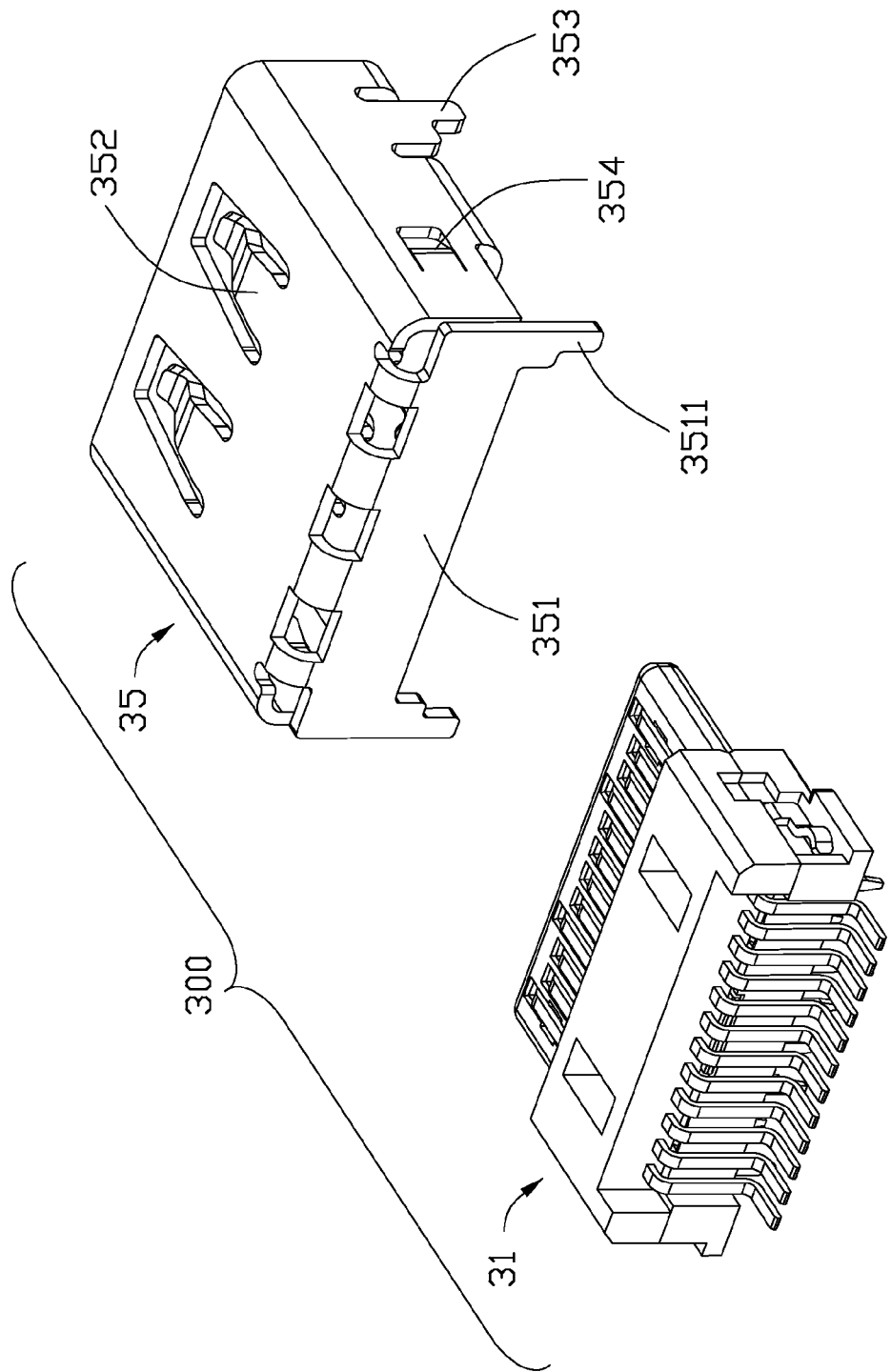
FIG. 8 is a rear perspective view of the receptacle connector with the further partially assembled housing of the receptacle connector of FIG. 4.
Figure 11:
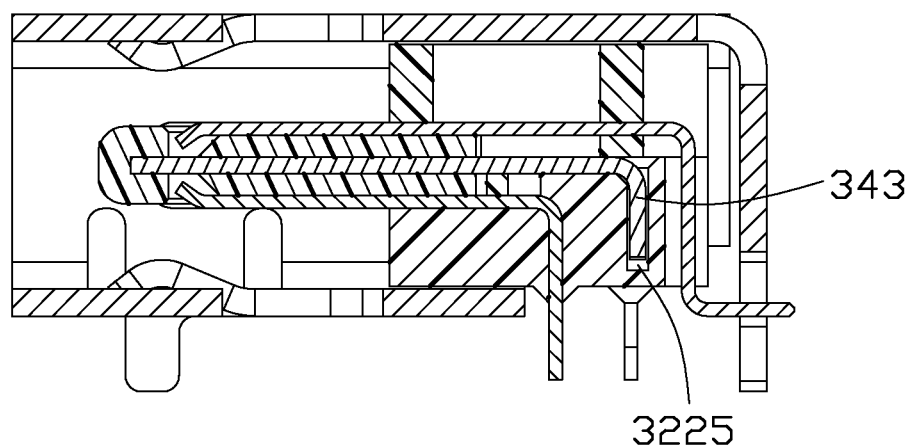
FIG. 11 is a cross-section view of the receptacle connector mounted on the printed circuit board, essentially showing an arrangement of the contacts and the shielding plate.

The upper terminal module 311 is assembled to the middle tongue 313 and the lower terminal module 312 as best shown in FIG. 8, wherein the post 3326 protruding beyond the shielding/grounding plate 34 and inserted into an opening 3315 as best shown in FIG. 11 through a lower face of the insulator of the upper terminal module 311. Therefore, the terminal module assembly 31 is configurated.

Figure 9:
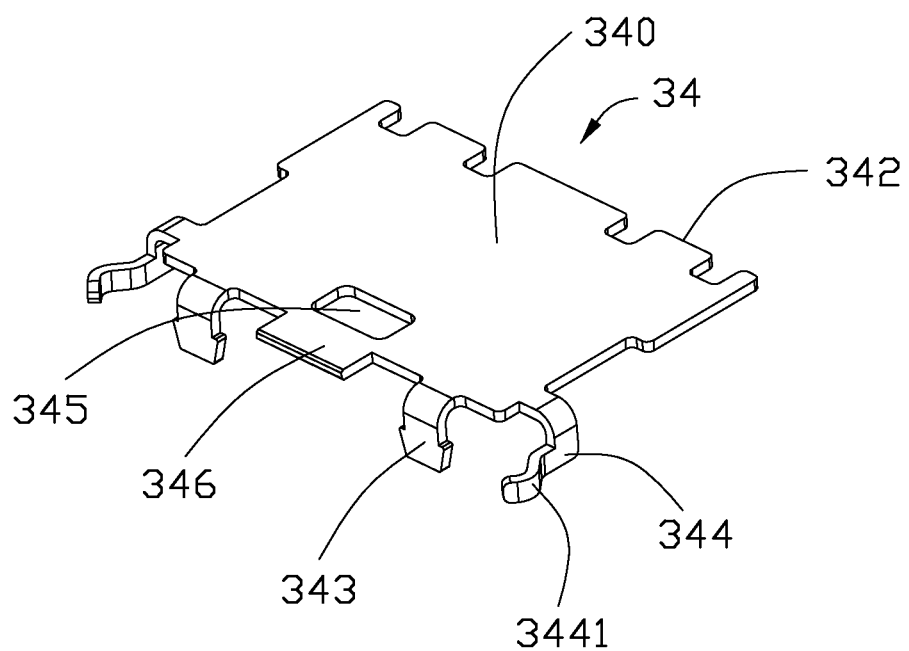
FIG. 9 is a rear perspective view of a shielding plate of the receptacle connector of FIG. 4.
Figure 10:
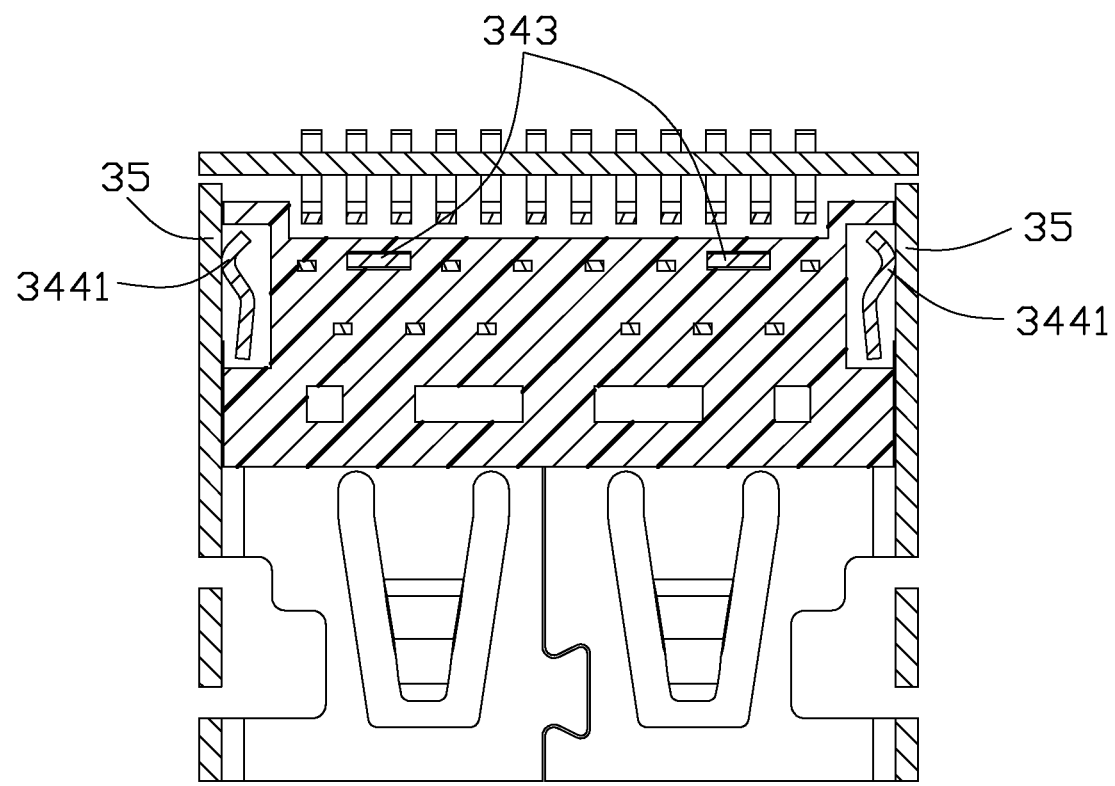
FIG. 10 is a cross-section view of the receptacle connector mounted on a printed circuit board, essentially showing an engagement of the spring tabs and the metallic shell.

A metallic shell 35 encloses the terminal module assembly 31 so as to form a mating cavity 301 in which the middle tongue 313 forwardly extends. The spring side tabs 344 electrically and mechanically contact the shell 35 as best shown in FIG. 10. Referring to FIG. 9, the shielding/grounding plate 34 includes front protruding edges 342 exposed outside of a corresponding edge of the middle insulator 333 for ESD (Electro Static Discharge) and anti-wearing during incorrect angular mating. The important issue of the mating plug connector 200 and receptacle connector 300 is that the plug connector 200 is flippable with regard to the receptacle connector 300 during mating with two different orientations. Understandably, to achieve this flippable function, the mechanical structure of the mating port of the receptacle connector 300 and that of the plug connector 200 optimally are of a symmetrical manner with regard to an imaginary horizontal center line. Correspondingly, the assignment of the contacts should be also in a symmetrical manner with regard to a center point in a diagonal manner, i.e., being reversed in both the vertical direction and the horizontal direction.

Figure 12:
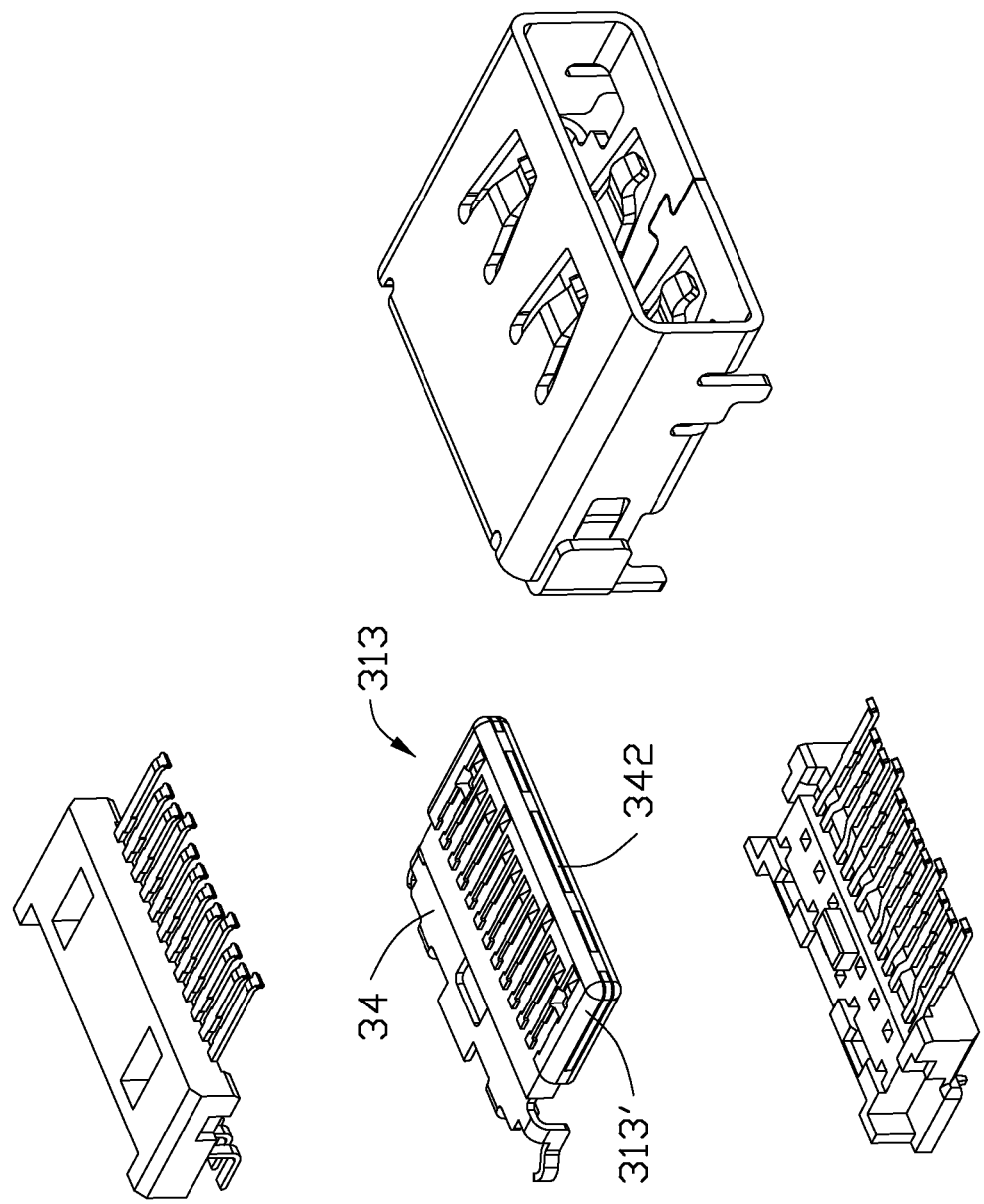
FIG. 12 is a front perspective view of another embodiment similar to FIG. 6(A) and FIG. 6(B)
Figure 13:
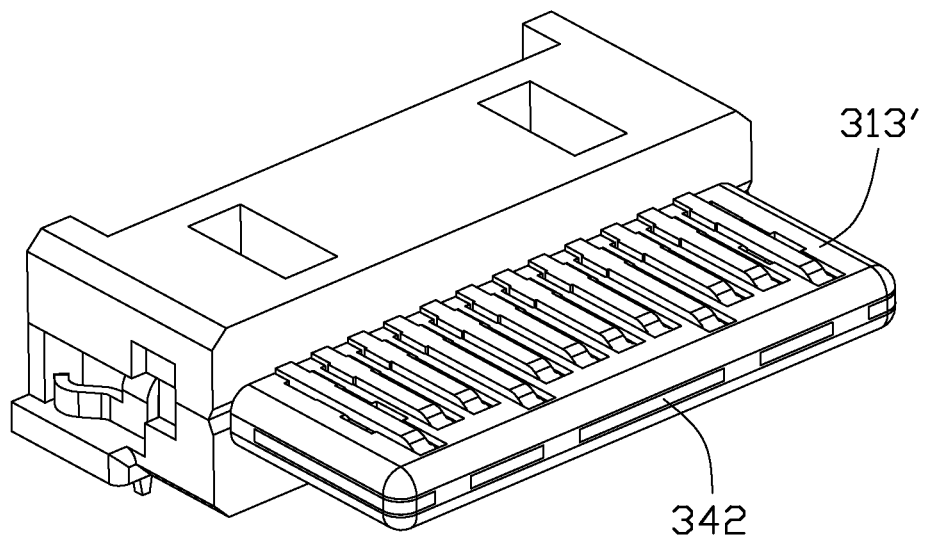
FIG. 13 is a front perspective view of a terminal module assembly of the receptacle connector of FIG. 12.
Figure 14:
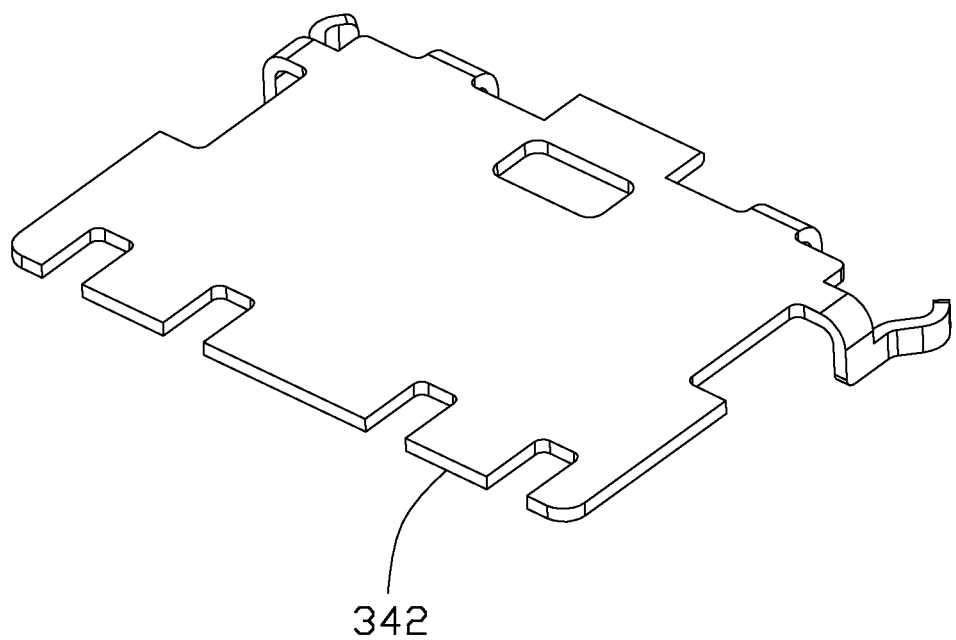
FIG. 14 is a front perspective view of the shielding plate in FIG. 12.
Figure 15:
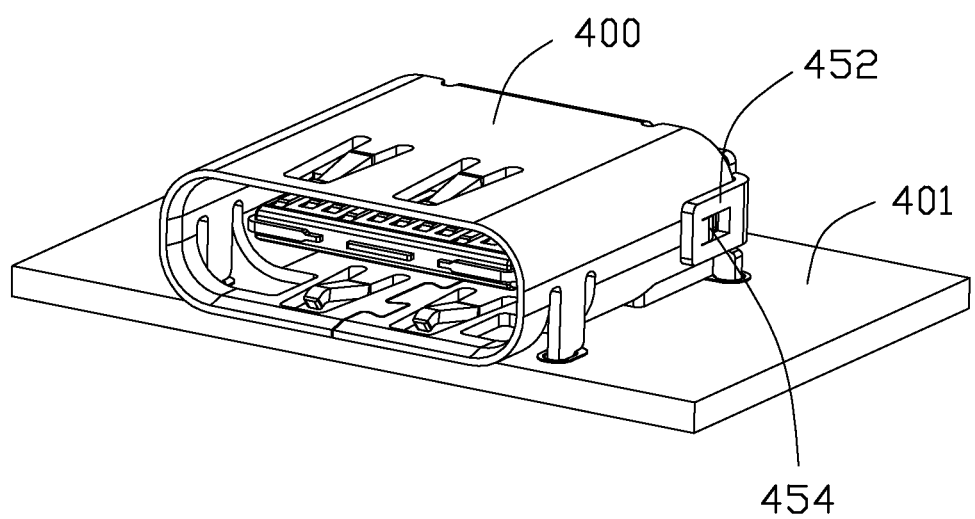
FIG. 15 is a front perspective view of a receptacle connector of a second embodiment of this invention; which is mounted on a printed circuit board.

FIGS. 12-14 is are essentially similar to FIGS. 4-11 to show the two features of the invention of which, the first one is the center insert molded shielding/grounding plate 34 encompasses the boundary of the mating tongue 313' of the middle tongue 313 and the front edges 342, exposed to corresponding front edges of the mating tongue 313', to prevent damage of the mating tongue when the corresponding plug connector 200 or even an incorrect other type plug connector is improperly incorrectly mated/inserted in a sidewardly angular manner, and the second one is the mating tongue 313' is essentially sandwiched between the upper insulator and the lower insulator in a flexible manner to prevent damage of the mating tongue when the plug connector 200 is incorrectly mated/inserted in an upward or downward tilted manner.

FIG. 15 through 21 shows the receptacle connector or first electrical connector 400 of a second embodiment for mounting to the printed circuit board 401, including a metallic shell 45 and a terminal assembly 41 essentially composed of the upper terminal module 411 with the upper contacts 421 inserted molded thereon and the lower terminal module 412 with the lower contacts 422 insert molded thereon to commonly sandwich the middle shielding plate module 413 in the vertical direction in the assembling way wherein the mating tongue 413' is provided by the middle shielding plate module 413 only and the shielding plate 44 is insert molded with the middle shielding plate module 413. The shell 45 restrains the terminal assembly 41 in the front-to-back direction by the rear lower edge of the capsular configuration of the shell 45 rearwardly abutting against the lower terminal module 412 and the rear cover 451 forwardly abutting against both the upper terminal module 411 and the lower terminal module 412. The rear cover forms a pair of locking ears 452 with lances 454 latched to the side region of the shell 45.

Figure 5:
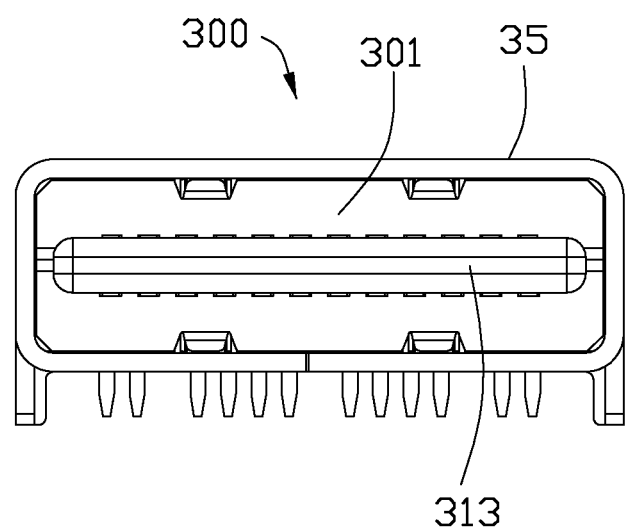
FIG. 5 is a front elevational view of the receptacle connector of FIG. 4.
Figure 6A:
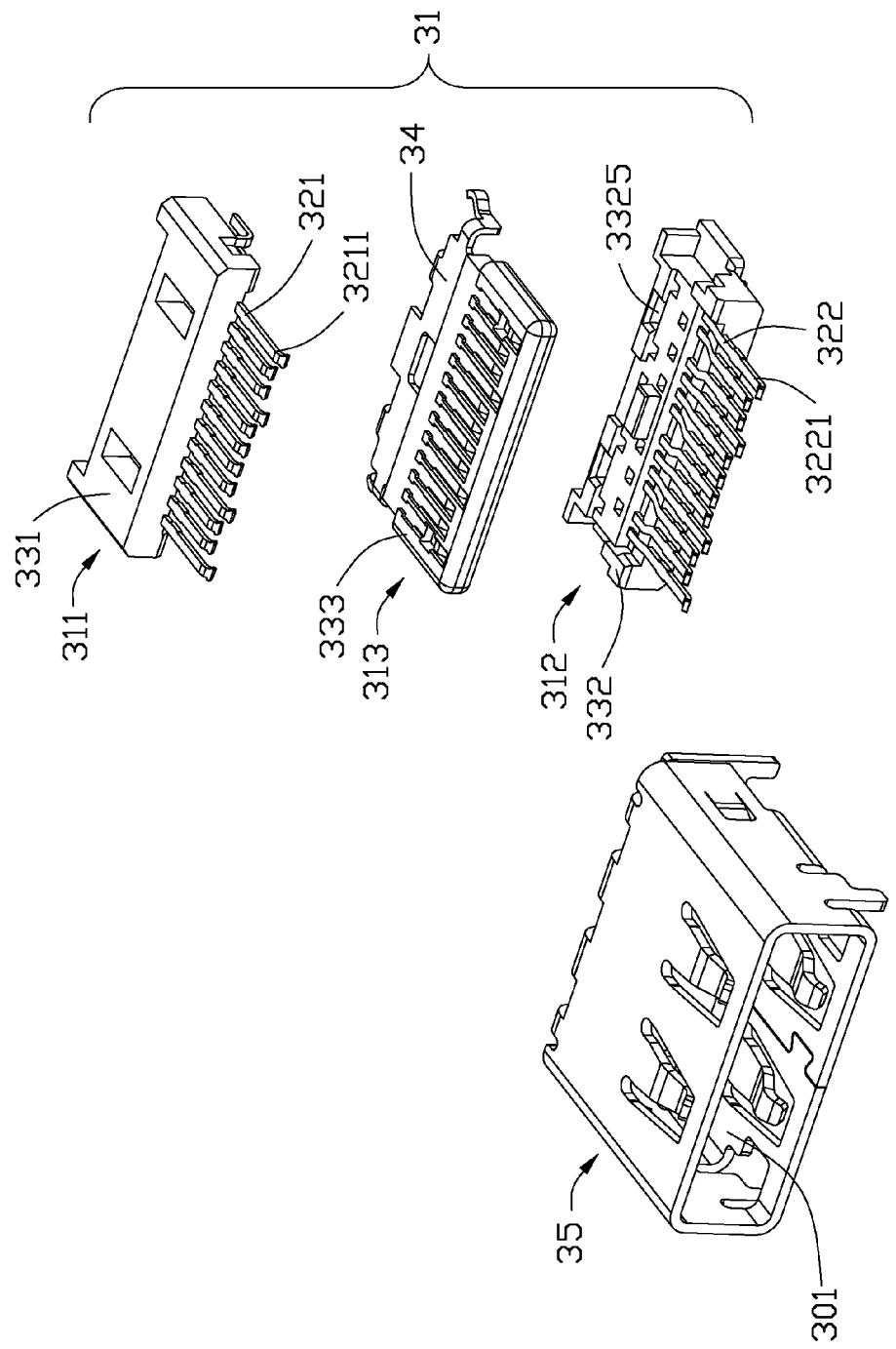
FIG. 6(A) is front exploded perspective view of the receptacle connector of FIG.
Figure 6B:
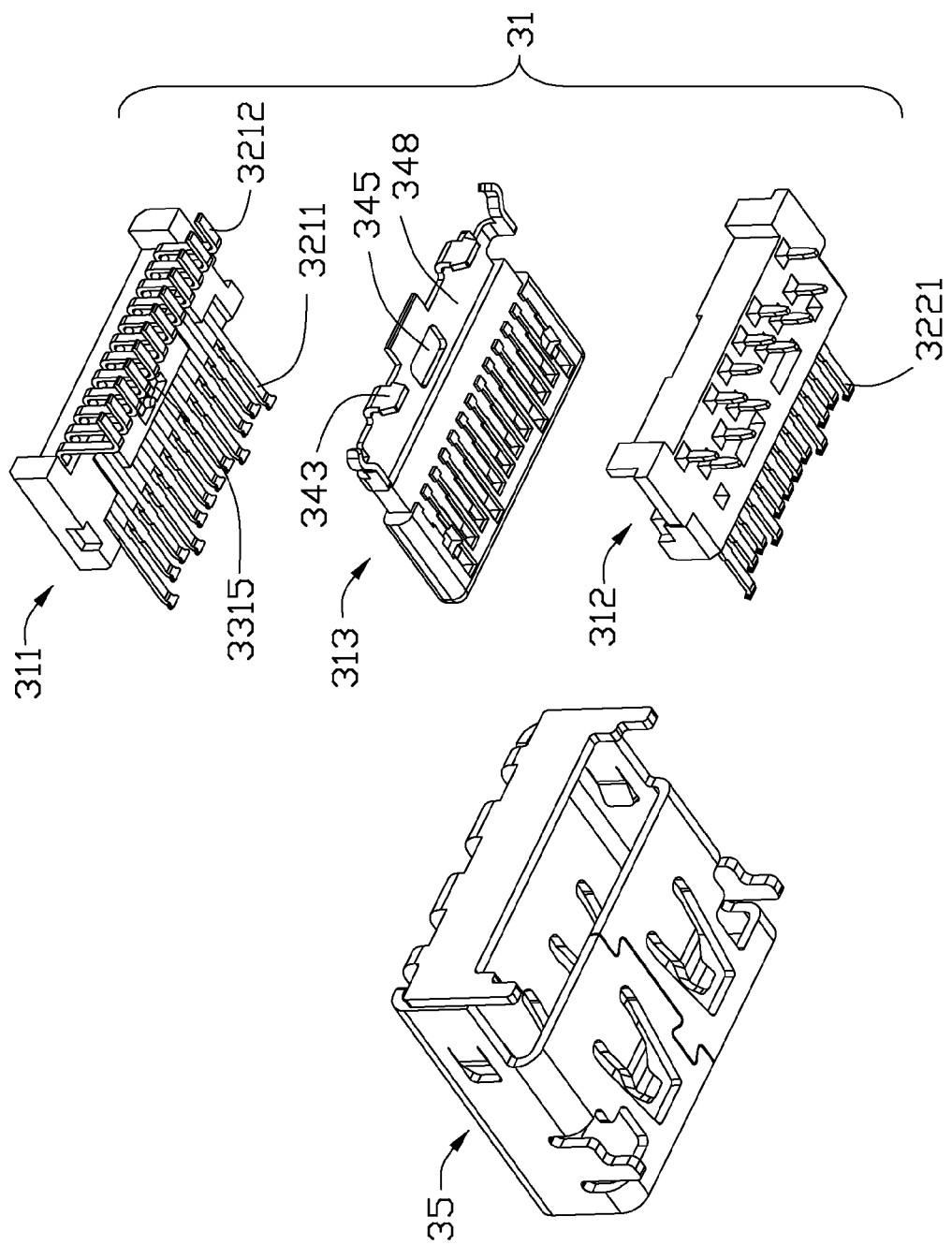
FIG. 6(B) is a rear exploded perspective view of the receptacle connector of FIG. 4.
Figure 16:
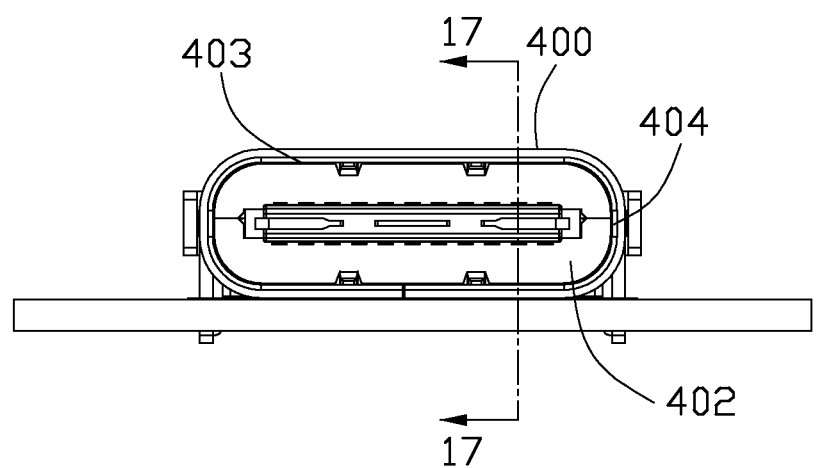
FIG. 16 is a front elevational view of the receptacle connector and the PCB of FIG. 15.

The receptacle connector 400 has an outlet of mating cavity 402 as best shown in FIG. 16 which is formed with the metallic shell 45. The outlet of the mating cavity 402 has two parallel longer-line sides 403 and two half-circle sides 404 connecting with the longer-line side 403, while the outlet of the receptacle connector 300 of the first embodiment is of rectangular shape as best shown in FIG. 5. The common ground is that the two receptacle connector is inserted with the corresponding plug connector in either of two insertion orientations.

Figure 17:
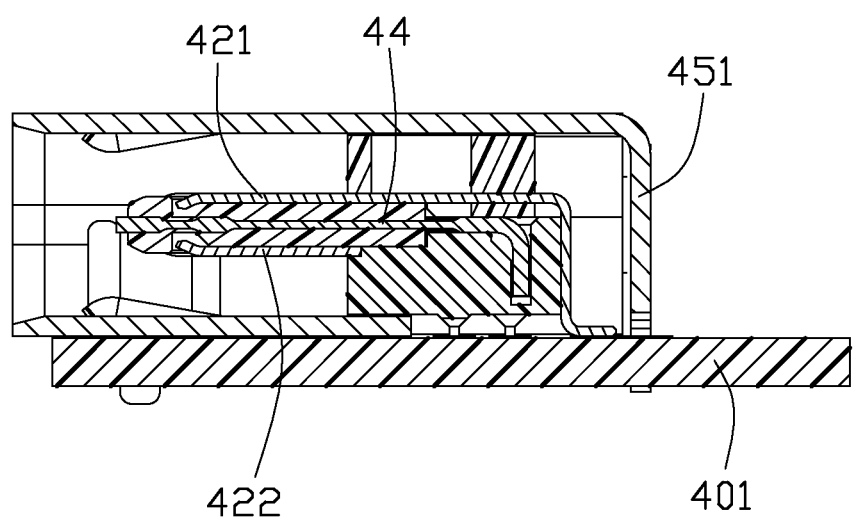
FIG. 17 is a cross section view of the receptacle connector and the PCB taken along lines 17-17 in FIG. 16.
Figure 18:
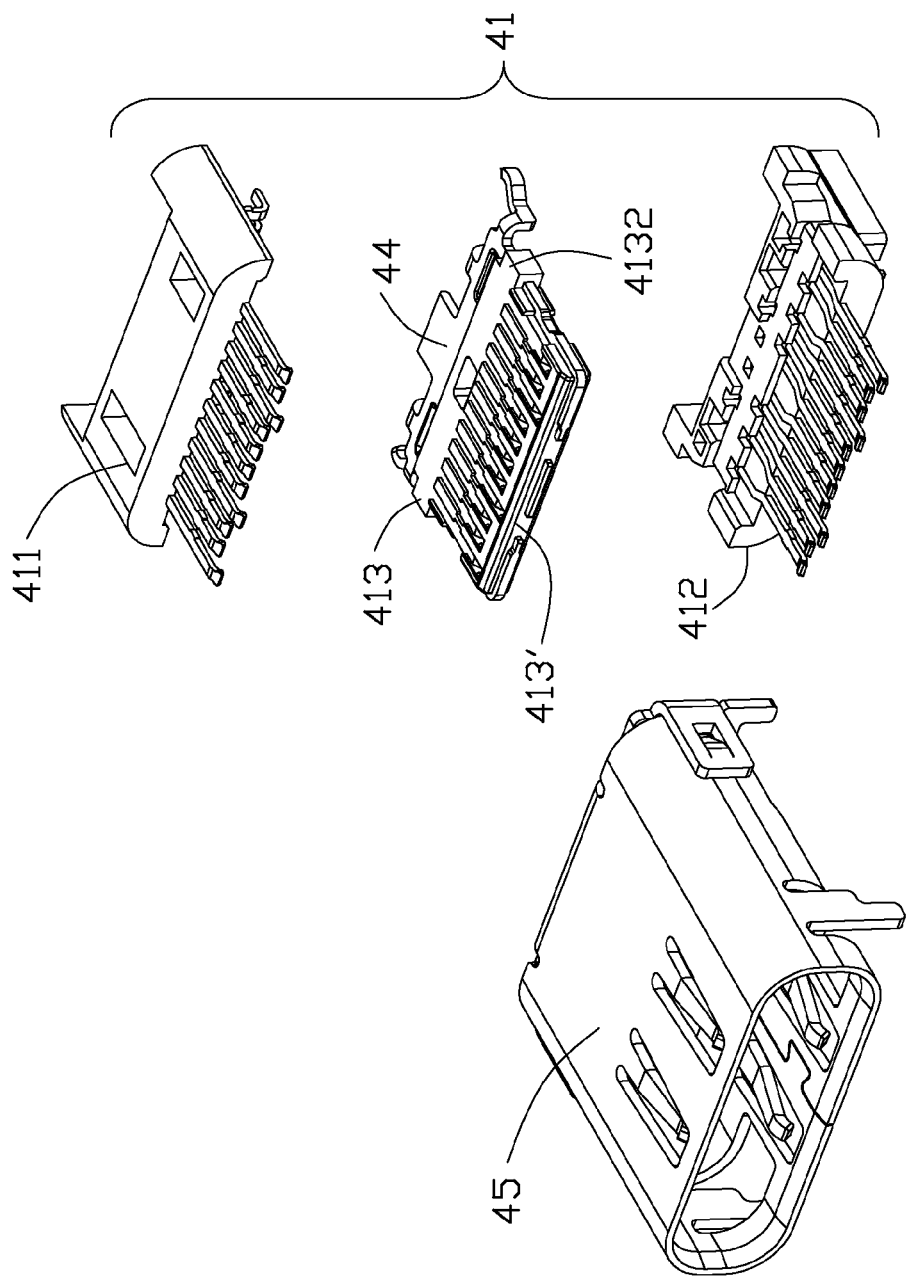
FIG. 18 is front exploded perspective view of the receptacle connector in FIG. 16.
Figure 18A:
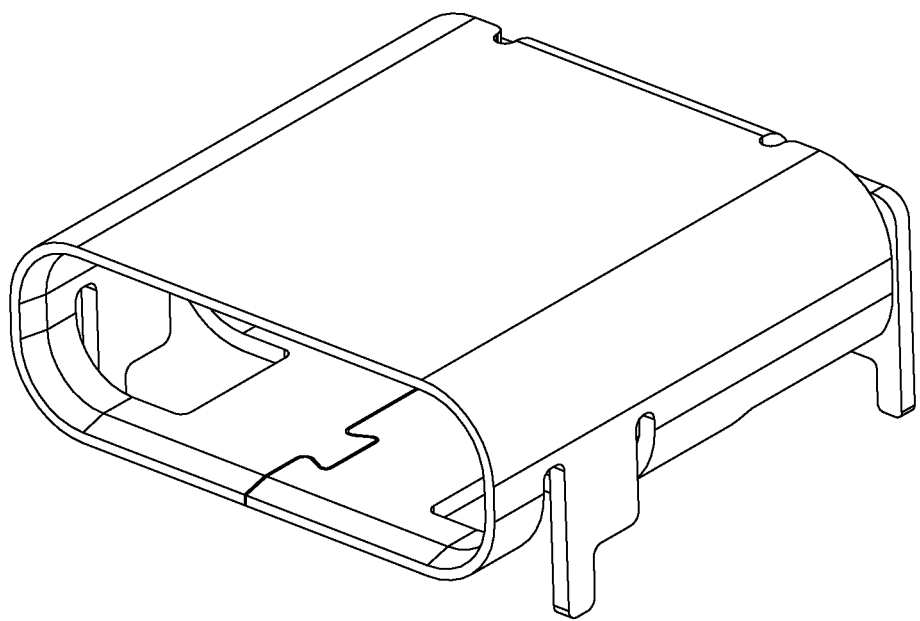
FIG. 18(B) is a front view of the assembled terminal module assembly of the receptacle connector of FIG. 16.
Figure 18B:
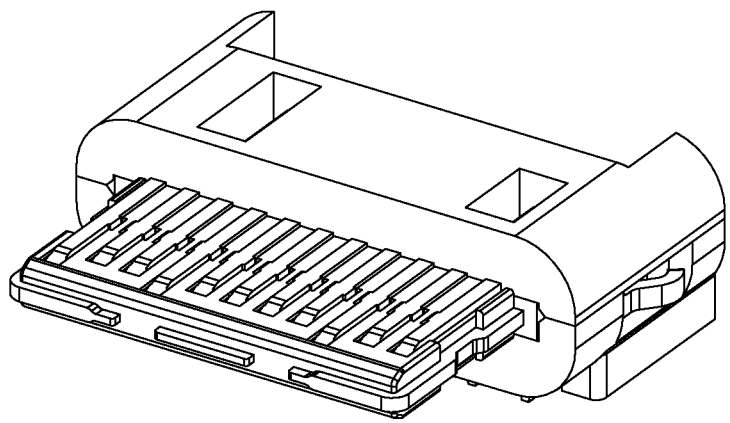
Figure 19:
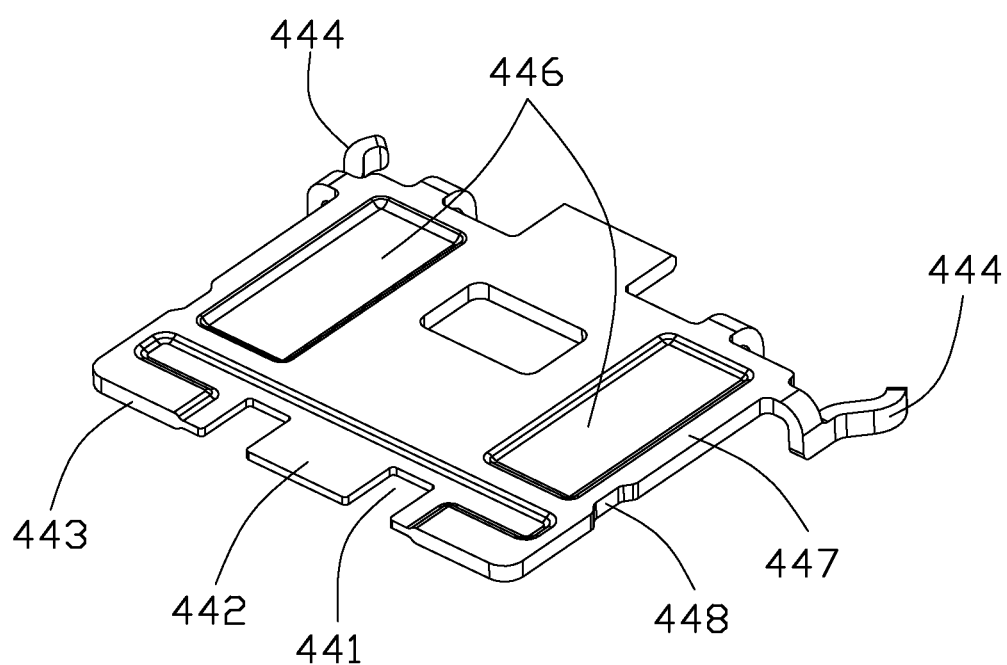
FIG. 19 is a front perspective view of the shielding plate in FIG. 16.
Figure 20:
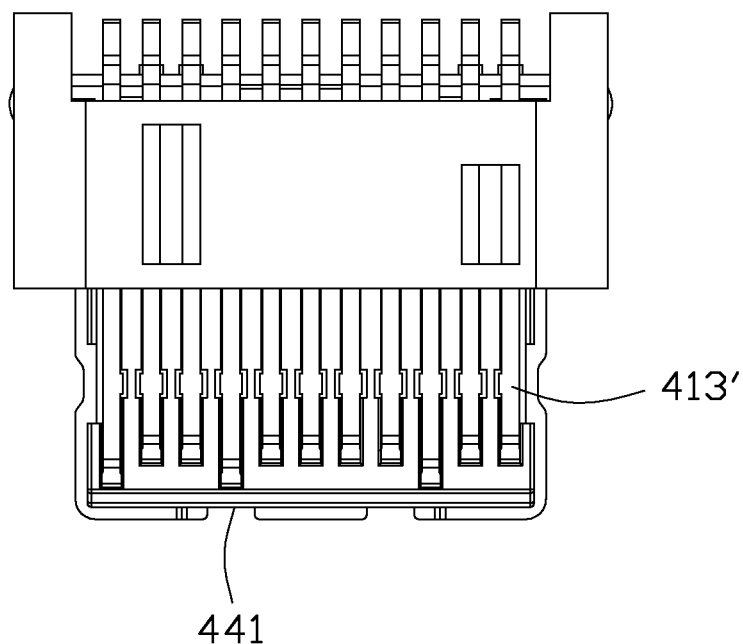
FIG. 20 is a top elevational view of the terminal module assembly.
Figure 21:
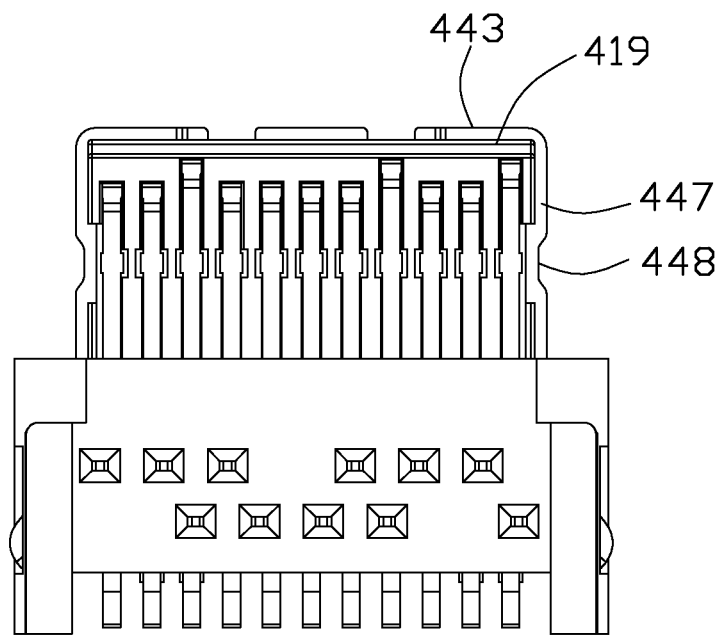
FIG. 21 is a bottom elevational view of the terminal module assembly.

The metallic shielding plate 44 for not only shielding but also reinforcing, defines two cutouts 441 in a front edge region and running through THE front edge thereof, and a thinned or even empty front region 442 wherein the front edge 443 extends slightly beyond the front edge 419 of the mating tongue 413' so as to efficiently prevent damage to the mating tongue 413' due to improper insertion of the (incorrect) plug connector. The cutout 441 is aligned with the corresponding power contact of the plug connector so as to prevent the power contact of the plug connector to contact the shielding plate 44, referring to FIG. 20. On the other hand, other contacts of the plug connector can contact the front edge 443 of the shielding plate 44 during initial mating. It is noted as best shown in FIG. 17 that thinned front edge region 442 may allow the front ends of the corresponding contacts to be inwardly deflected to form a lead-in configuration for better retention and easy insertion without a shorting risk induced by the external part. The shielding plate 44 further defines thinner regions 446 at a rear region thereof to improve SS impedance control. The spring tabs 444 are adapted to be electrically and mechanically connected to the shell 45. The lateral side edges 447 of the shielding plate 44 protrude the mating tongue 413' and a notch 448 is defined on each lateral side edges 447 to assure direct touch/lock with a metal latch 209 of a plug connector 500 shown in FIGS. 24-26.

Figure 24:
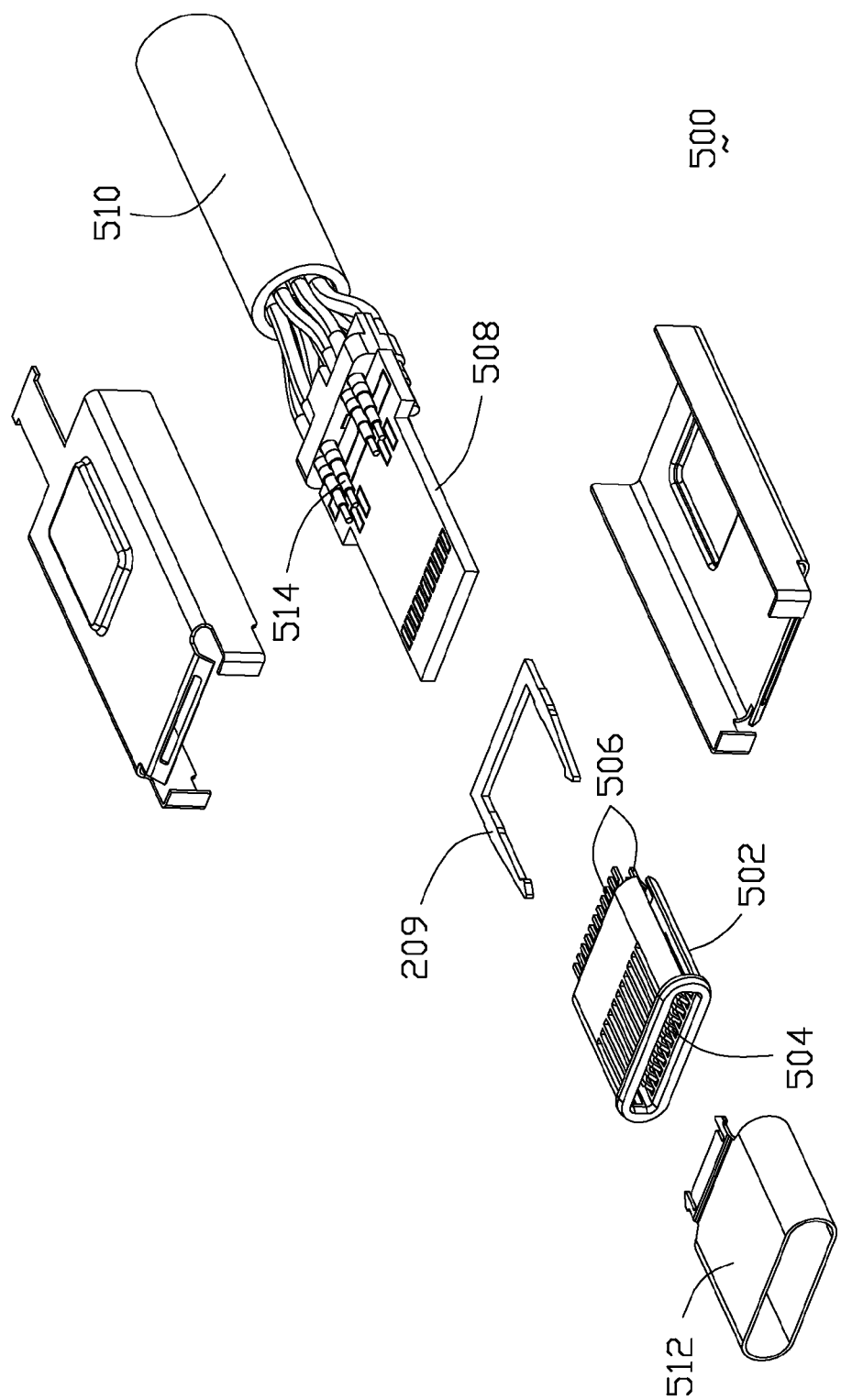
FIG. 24 is a front exploded perspective view of the plug connector (not showing the outer jacket) for use with the receptacle connector of FIG. 15 or FIG. 23.
Figure 25:
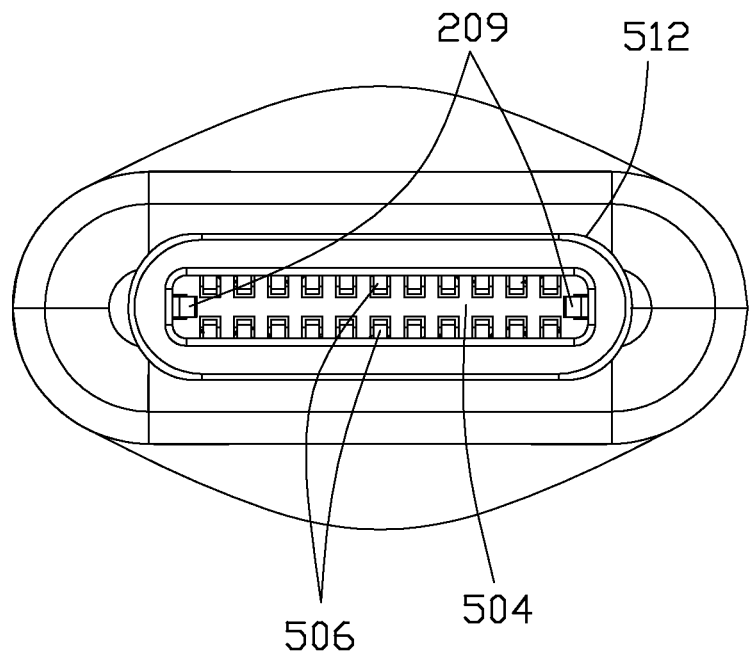
FIG. 25 is a front elevational view of the plug connector of FIG. 24.
Figure 26:
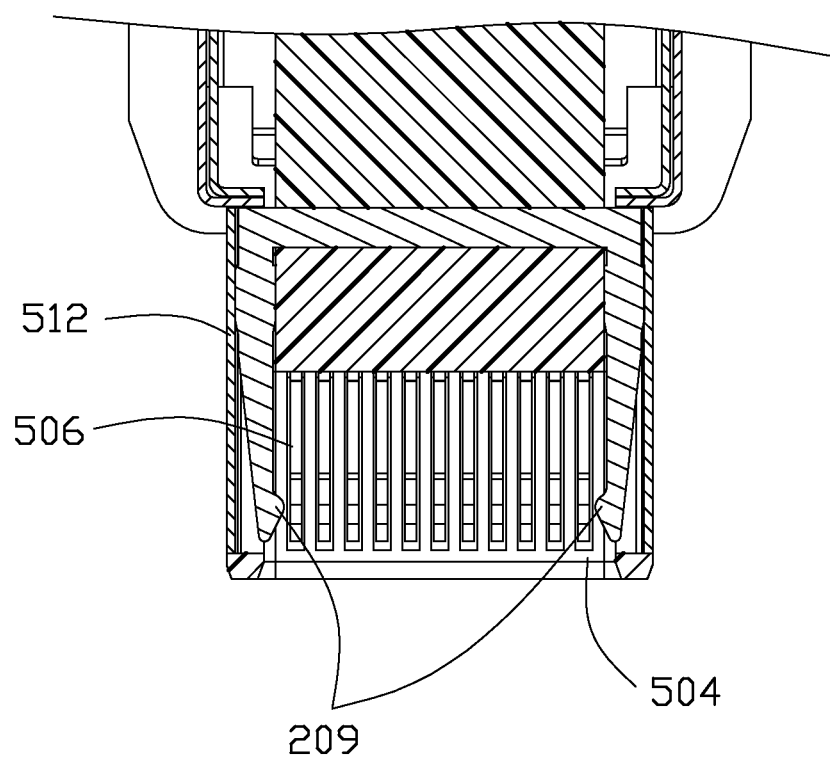
FIG. 26 is a cross-sectional view of the plug connector of FIG. 24.
Figure 27:
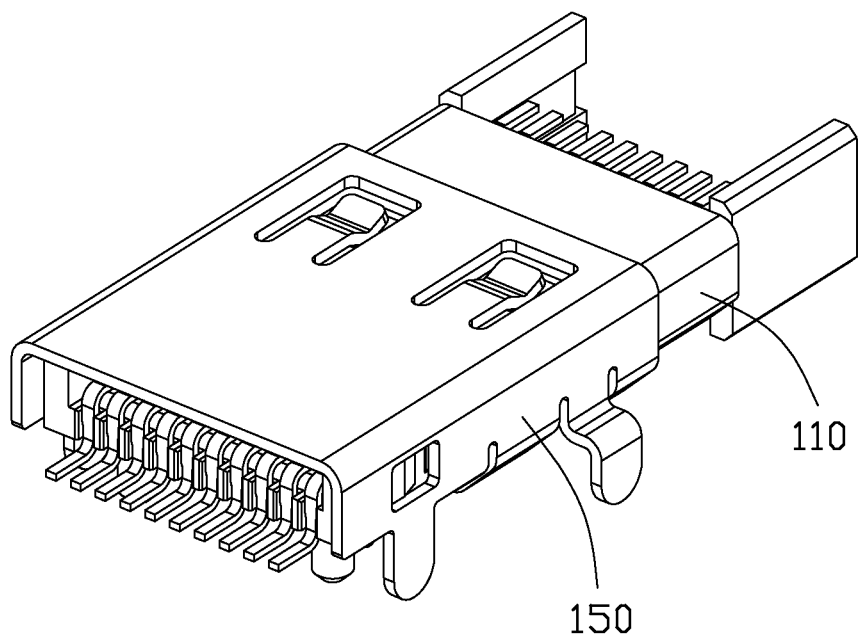
FIG. 27 is a rear assembled perspective view of the mated receptacle connector and plug connected according to a fifth embodiment of the present invention.
Figure 28:
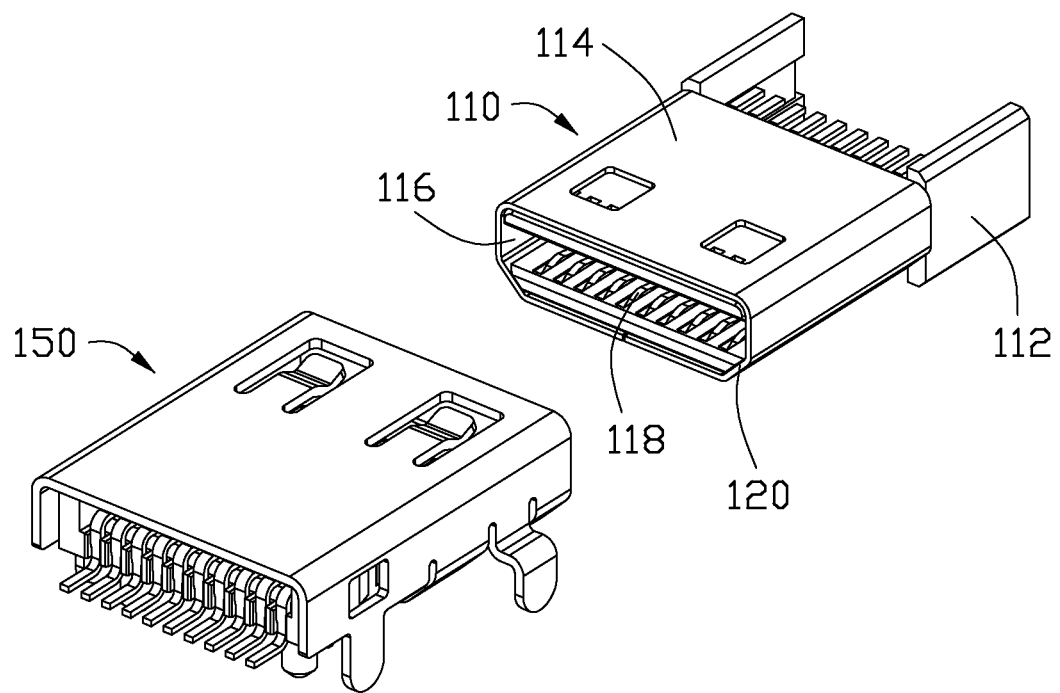
FIG. 28 is a rear assembled perspective view of the plug connector and the receptacle connector of FIG. 27 in an un-mated condition.
Figure 29:
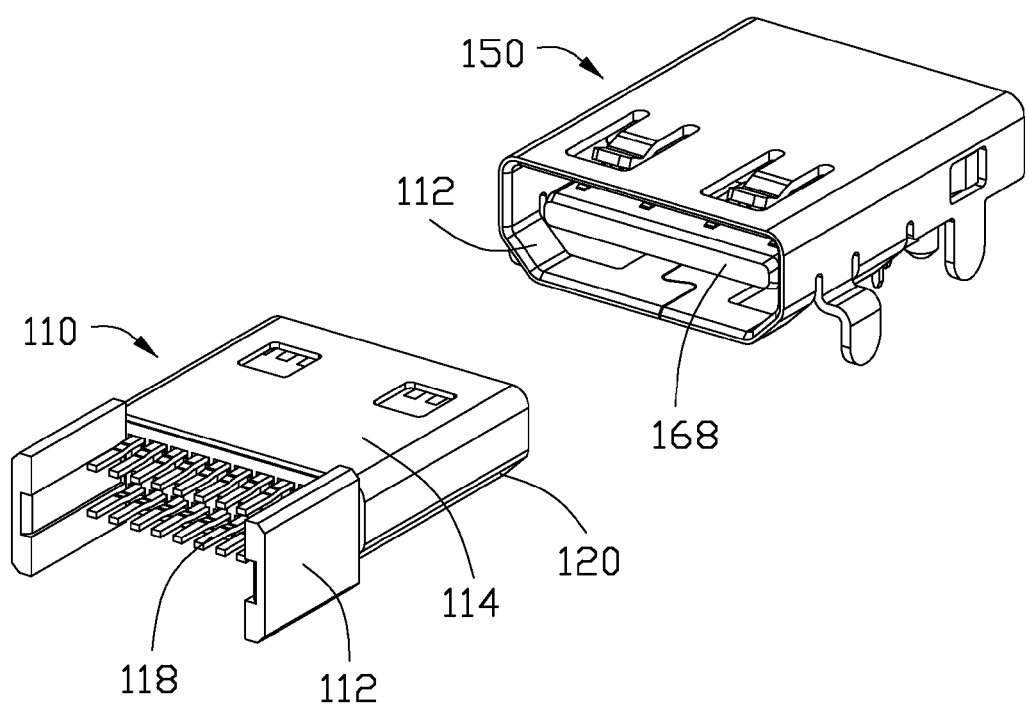
FIG. 29 is a rear assembled perspective view of the plug connector and the receptacle connector of FIG. 27 in an un-mated condition.
Figure 30:
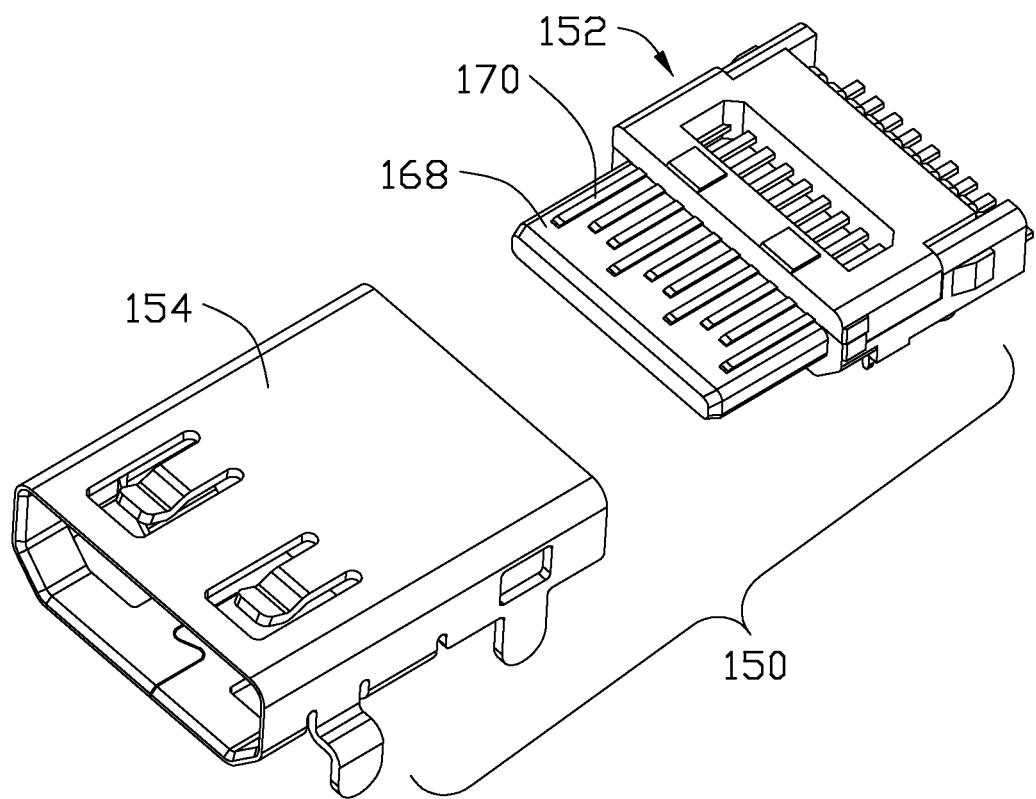
FIG. 30 is a front exploded perspective view of the receptacle connector of FIG. 27.
Figure 31:
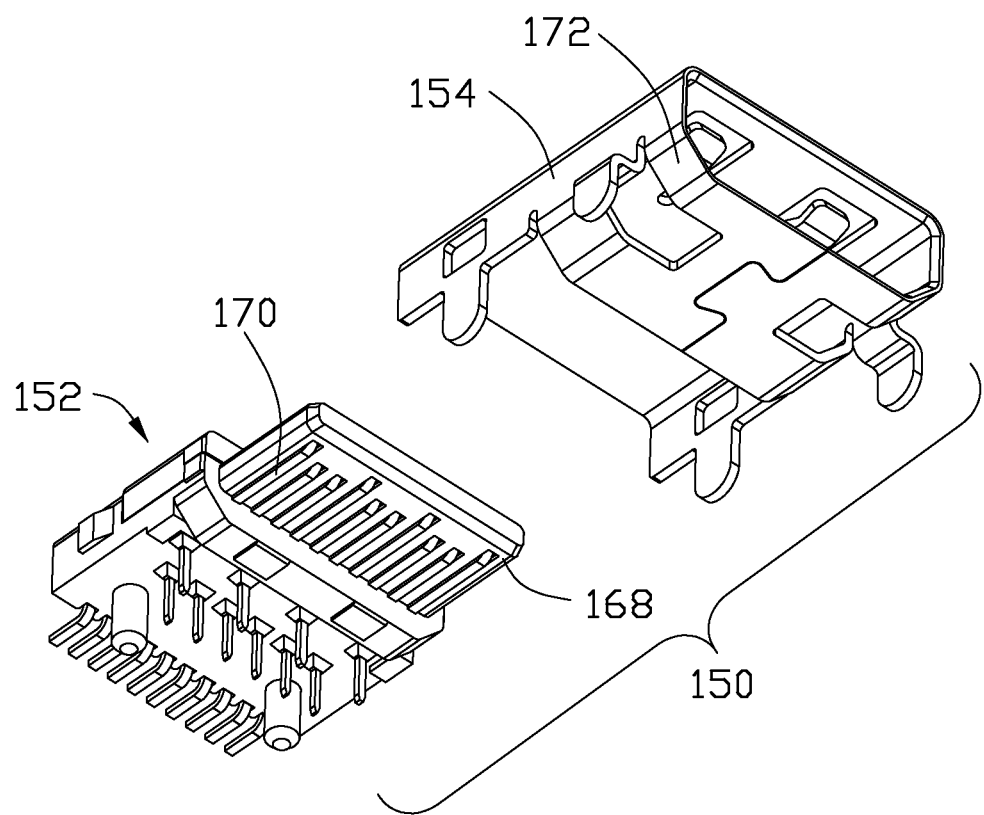
FIG. 31 is rear exploded perspective view of the receptacle connector of FIG. 27.
Figure 32:
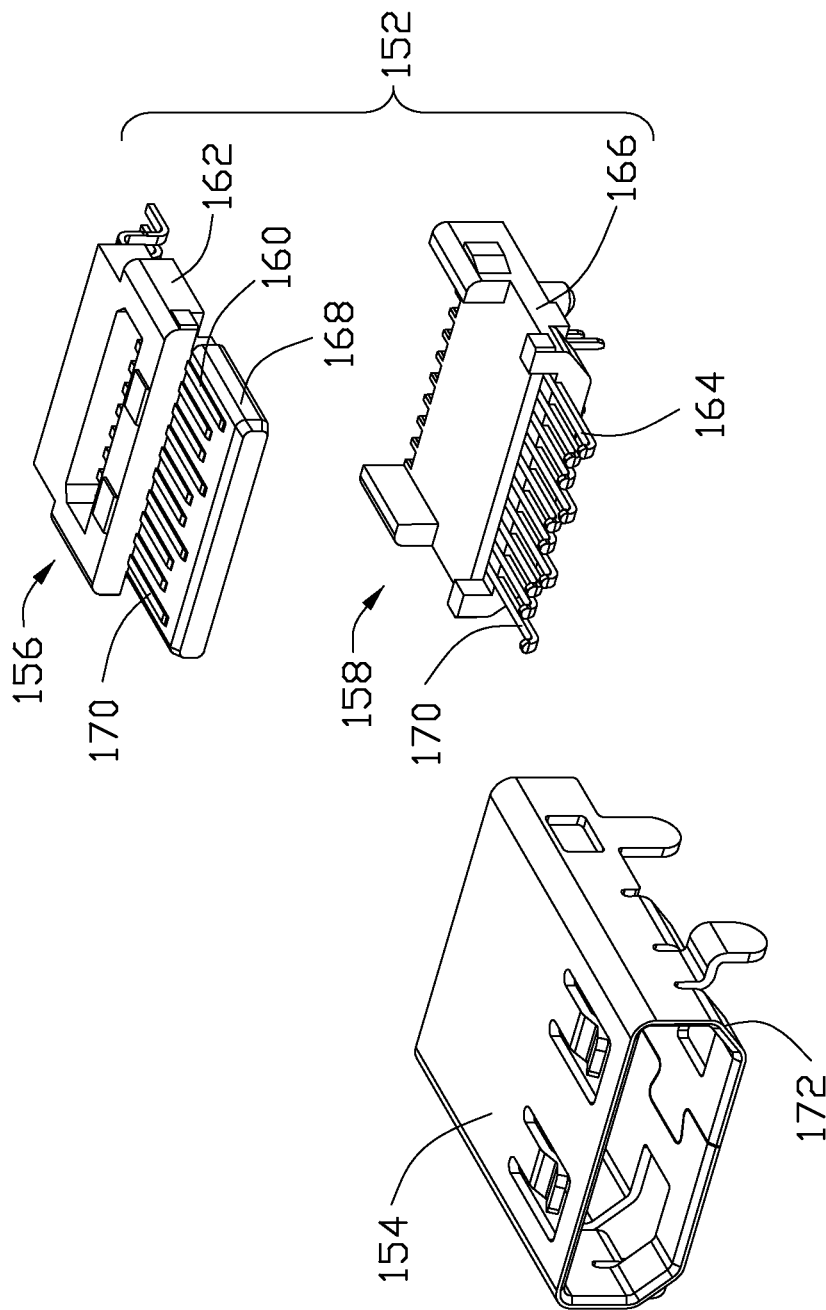
FIG. 32 is a front exploded perspective view of the receptacle connector of FIG. 27 to show the discrete terminal modules.
Figure 33:
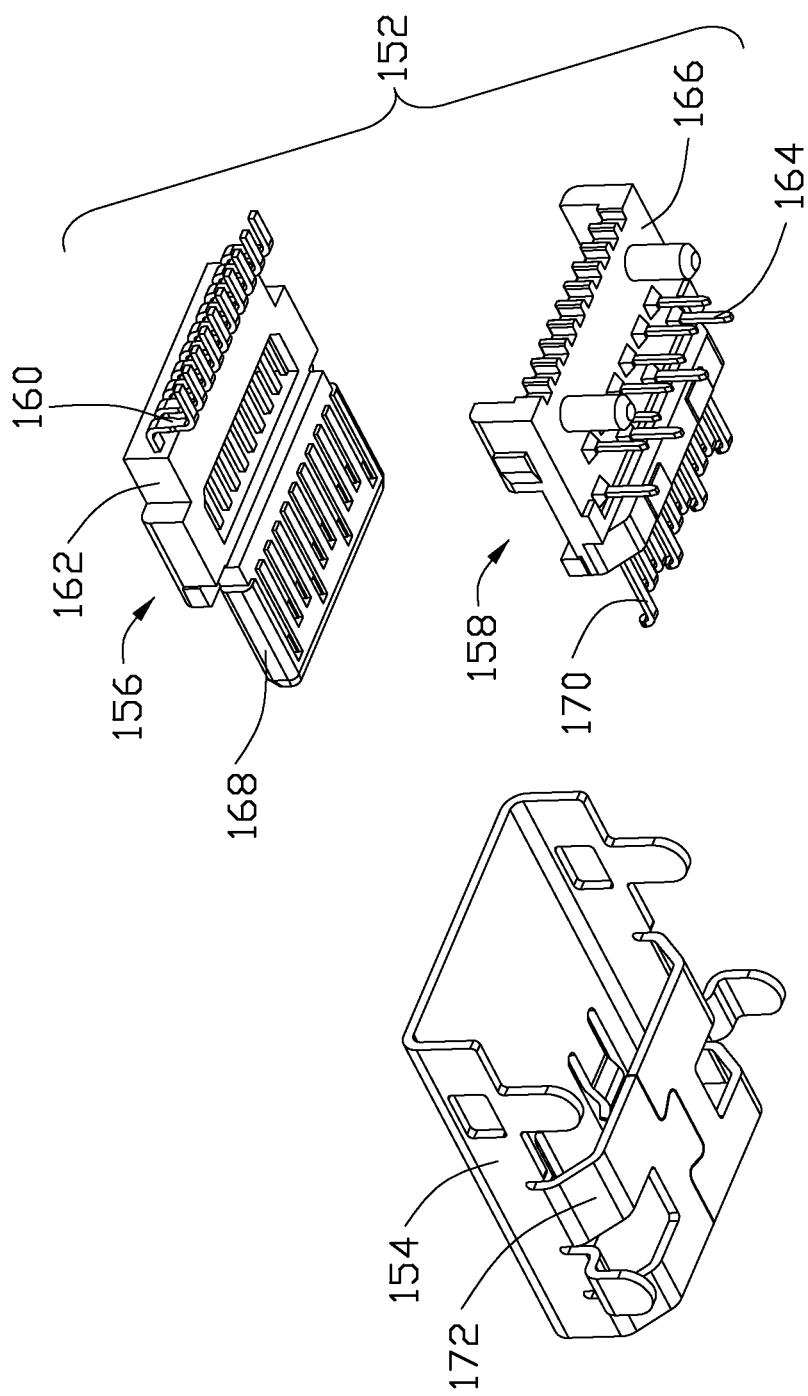
FIG. 33 is a rear exploded perspective view of the receptacle connector of FIG. 27 to show the discrete terminal modules.
Figure 34:
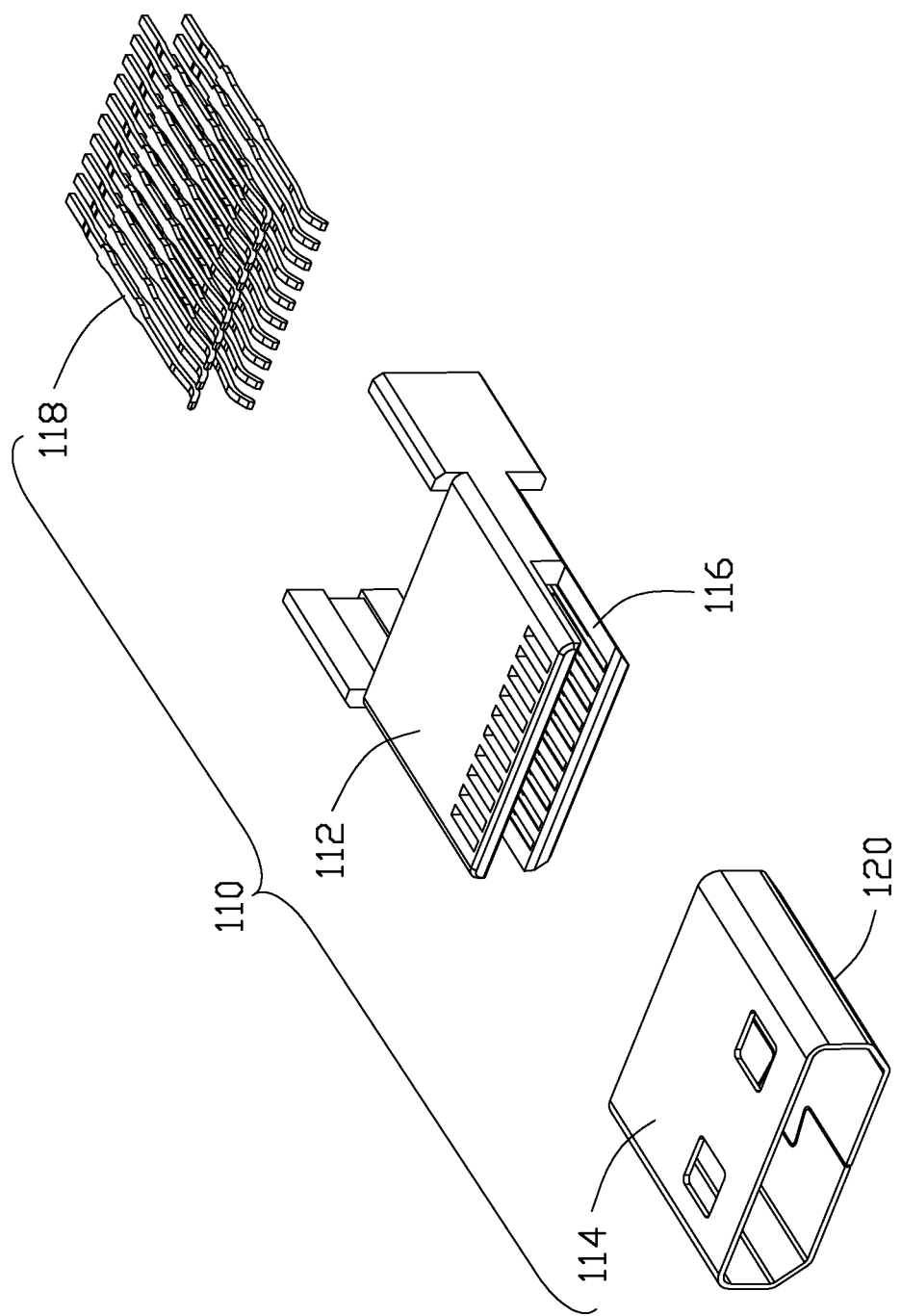
FIG. 34 is a front exploded perspective view of the plug connector of FIG. 27.
Figure 35:
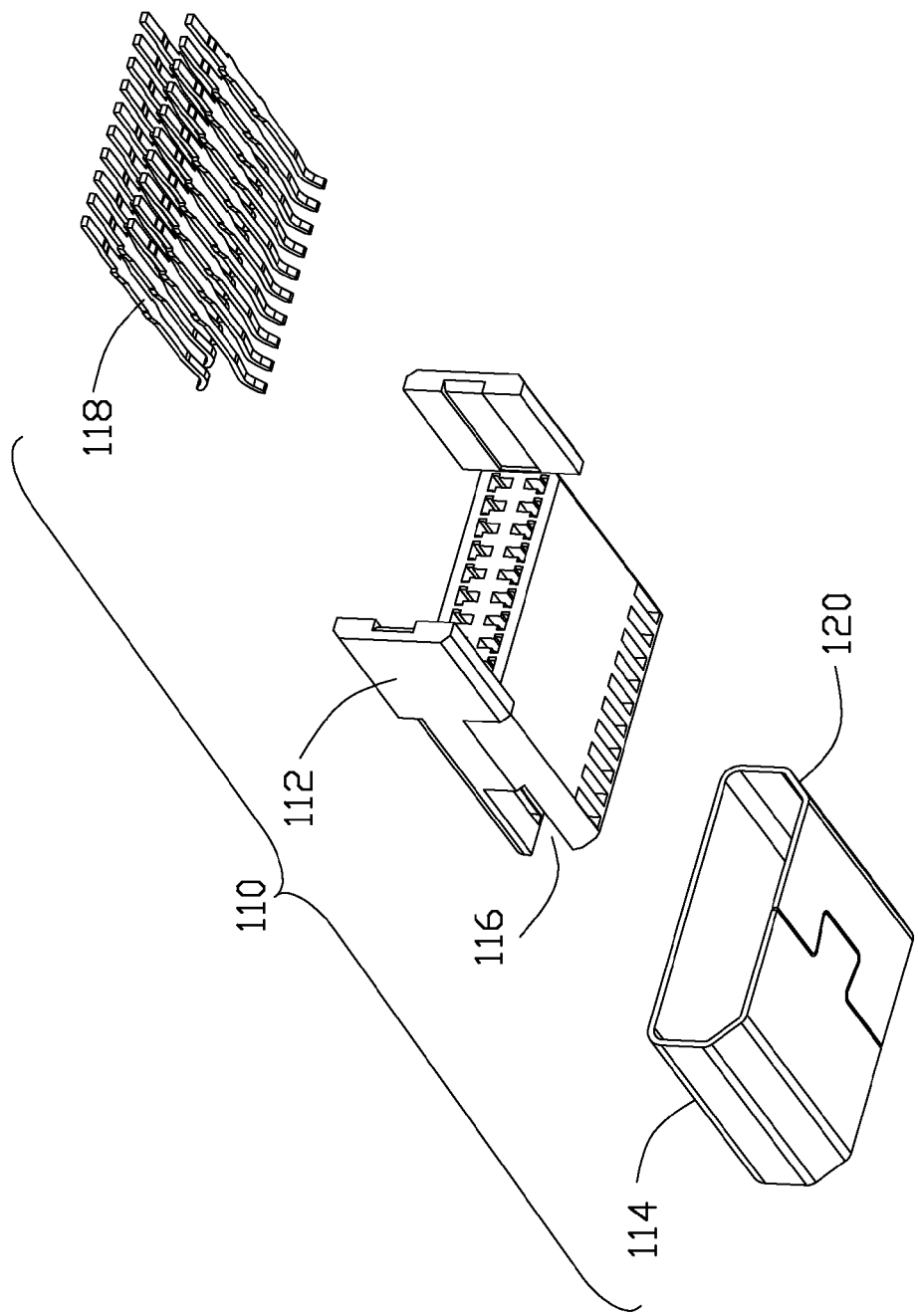
FIG. 35 is a rear exploded perspective view of the plug connector of FIG. 33.
Figure 36:
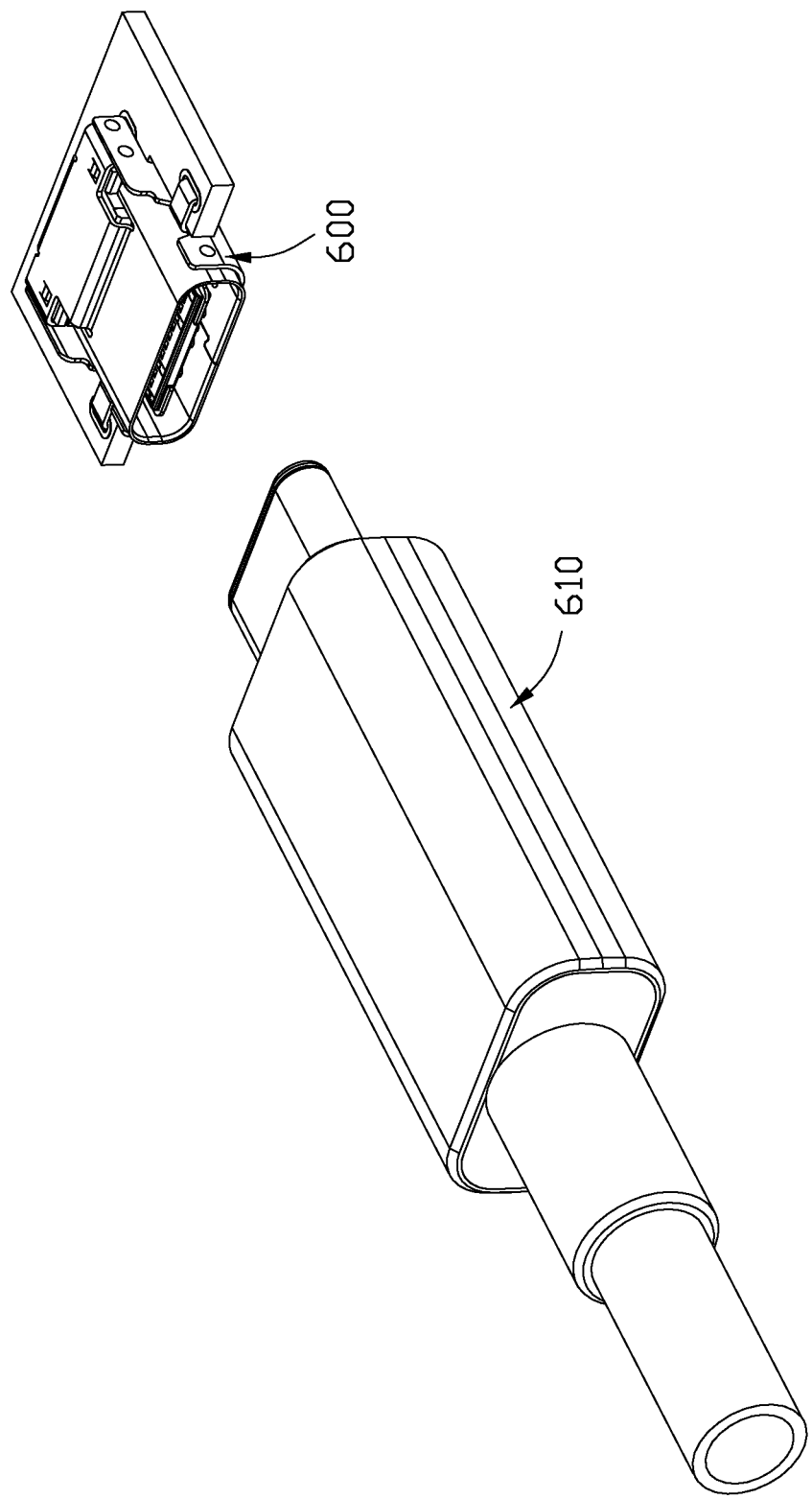
FIG. 36 is a rear exploded perspective view of the receptacle connector and the plug connector according to another embodiment of the present invention'
Figure 37:
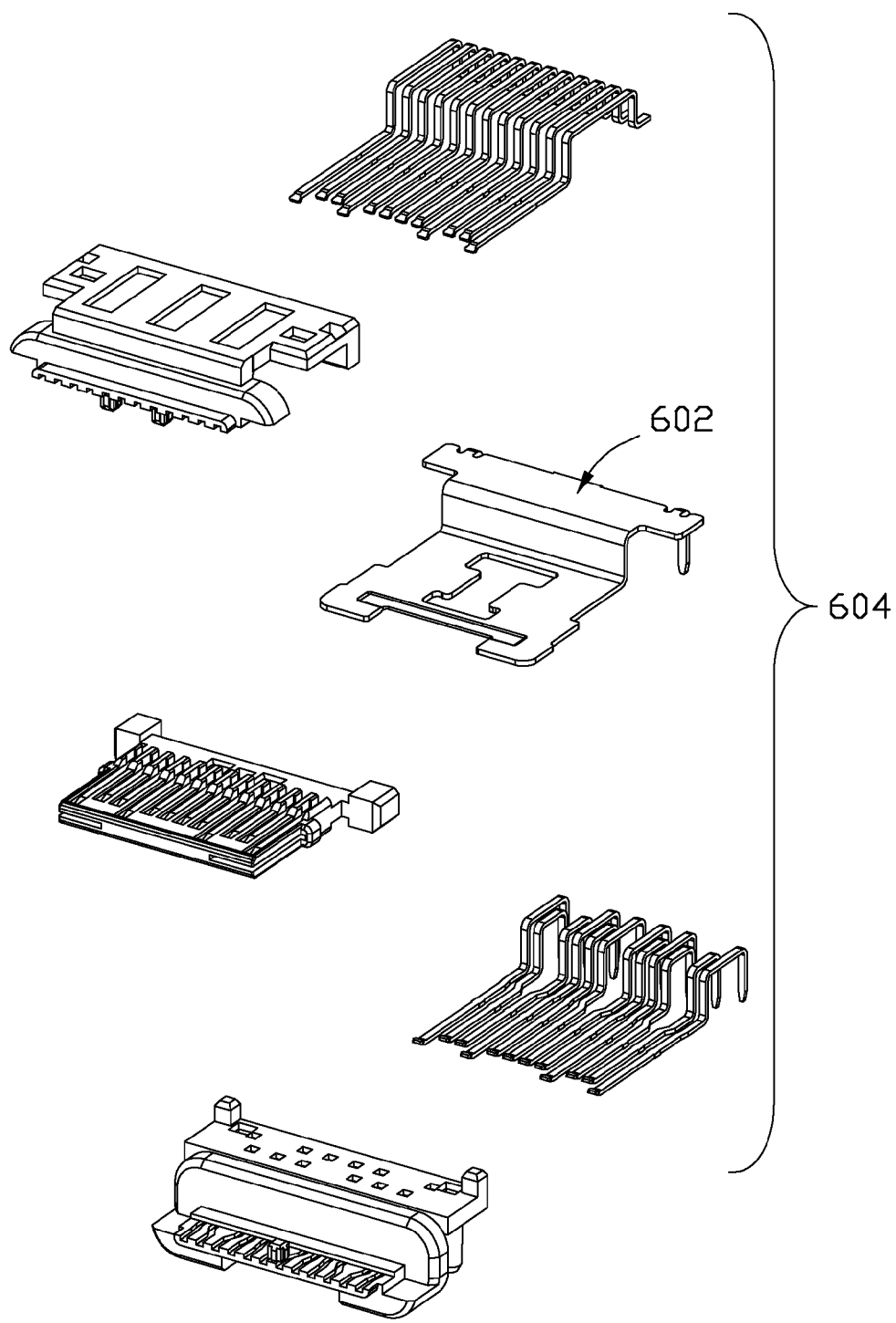
FIG. 37 is front exploded perspective view of the terminal module assembly of the receptacle connector of FIG. 36.
Figure 38:
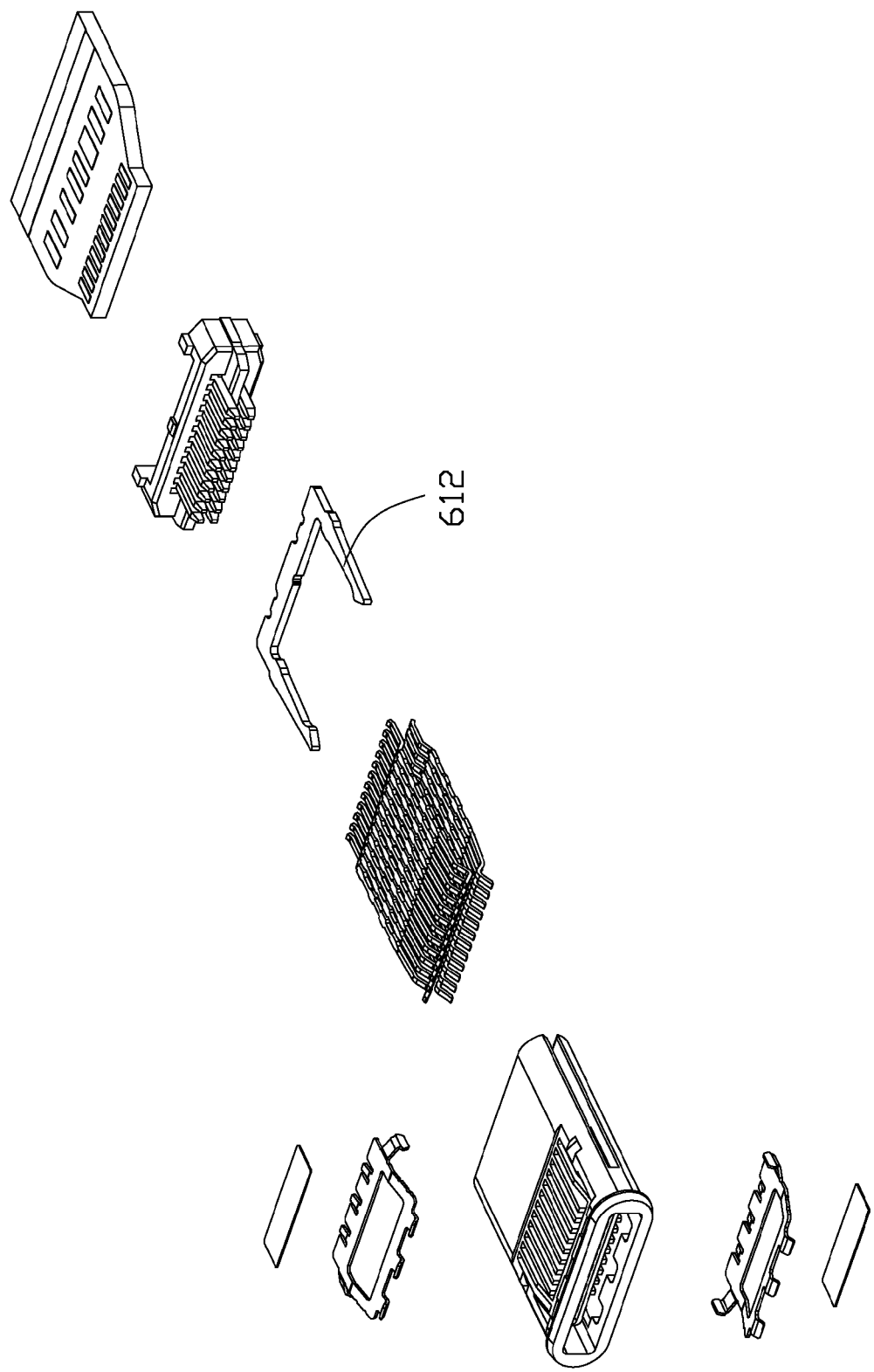
FIG. 38 is a front exploded perspective view of the plug connector of FIG. 36.
Figure 39:
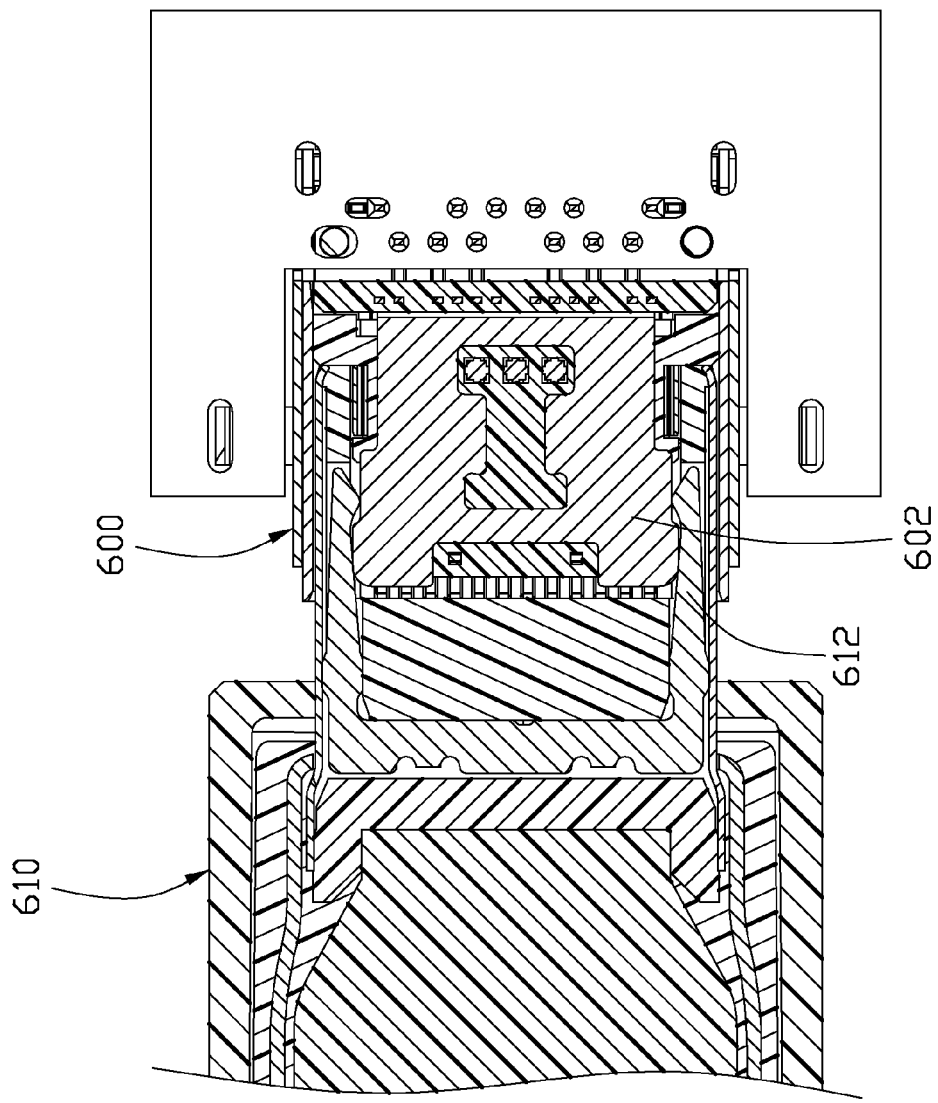
FIG. 39 is a cross-sectional view of the assembled plug connector and receptacle connector to show the engagement between the shielding plate of the receptacle connector and the latch of the plug connector.

Referring to FIGS. 24-26, the plug connector 500 includes an insulative housing 502 defining a receiving cavity 504 with two rows of contacts 506 extending thereinto. The tails of the contacts 506 are mechanically and electrically connected to a paddle card 508 behind the housing 502, and a cable 510 having a plurality of wires 514 mechanically and electrically connected to the paddle card 508. The latch 209 defining a pair of lateral deflectable arms, is positioned in front of the paddle card 508 and extends into the receiving cavity 504 to mechanically and electrically connect to the shielding plate 44. A metallic shell 512 encloses the housing 502, and a pair of metallic covers enclosing the housing 502 and the paddle card 508 and is fastened to the cable 510.

Figure 22A:
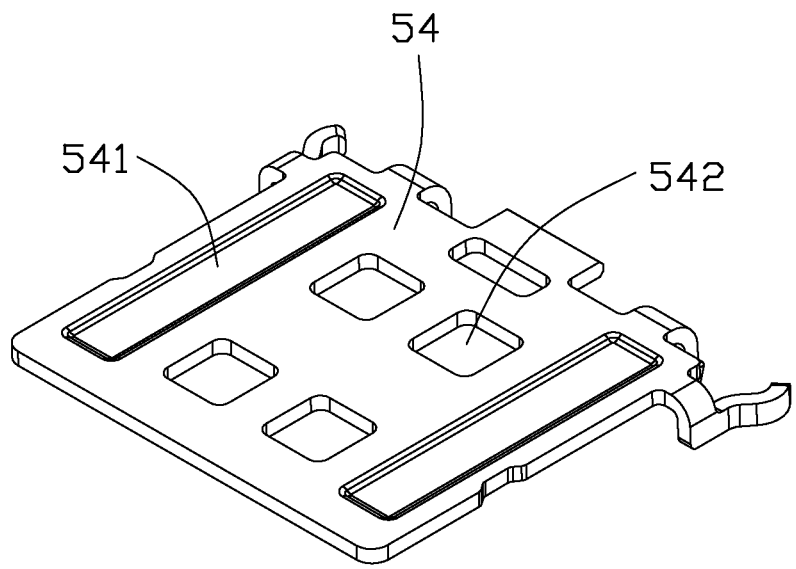
FIG. 22(A) is a front perspective view of another embodiment of the shielding plate for use with the receptacle connector.
Figure 22B:
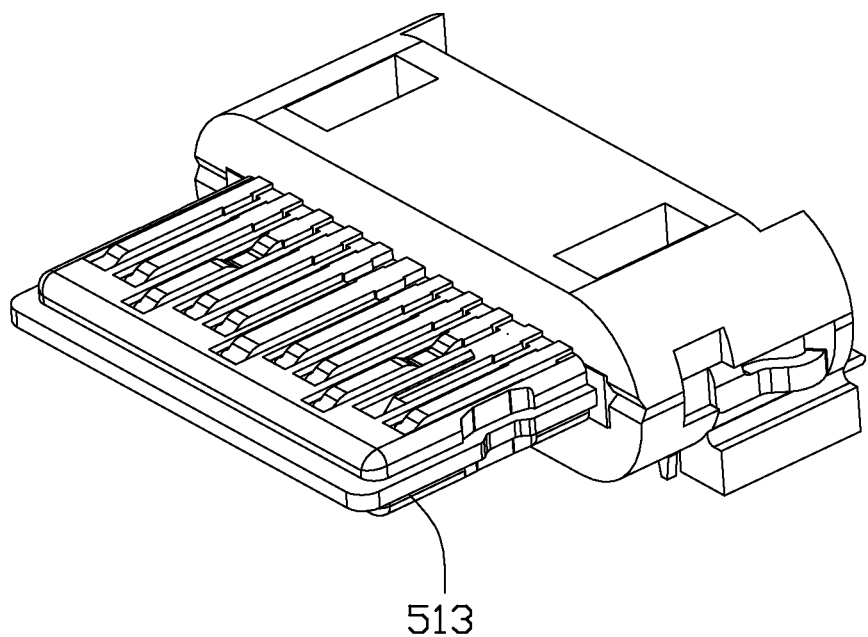
FIG. 22(B) is a front perspective view of the assembled terminal module assembly for use with the shielding plate of 22(A)
Figure 23:
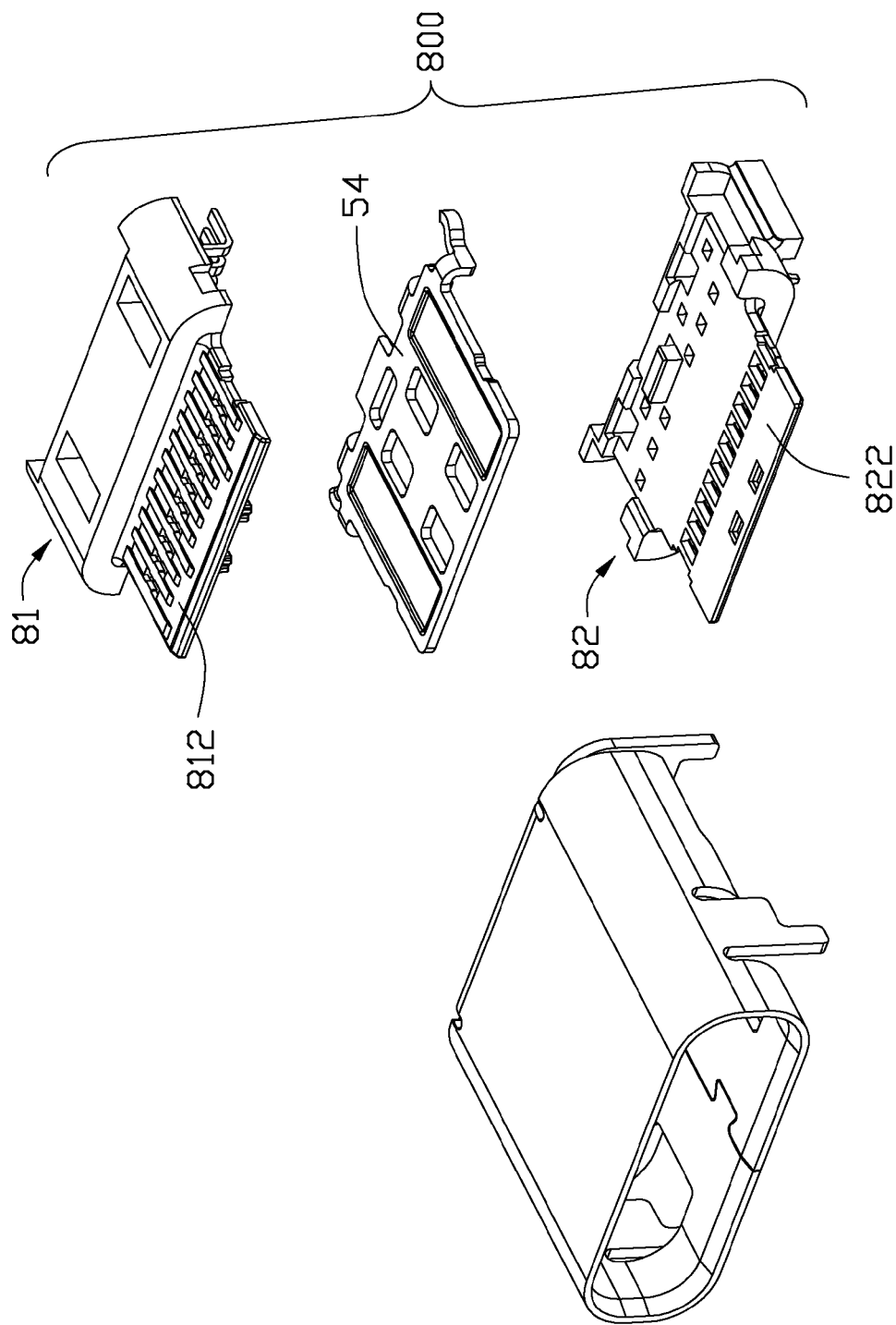
FIG. 23 is a front exploded perspective view of the terminal module assembly of FIG. 22(B) and the metallic shield adapted to enclose thereon.

FIG. 22(A)-23 show a third embodiment similar to the receptacle connector 400 of the second embodiment, wherein the shielding plate 54 of the receptacle connector protrudes out of the front edge and the side edge of the mating tongue 513 for performing the anti-mismating and efficient grounding and locking functions. Two thinner regions 541 and four cutouts 542 between the two thinner regions 541 are defined in the shielding plate, which are just aligned with the signal contacts 52 to improve SS impedance control. One major difference between the receptacle connector 400 in FIGS. 16-21 and the receptacle connector 800 in FIGS. 22(A)-23 is that the former has the middle shielding plate module 413 itself to form the mating tongue while the latter has the upper mating tongue 812 of the upper terminal module 81 and the lower mating tongue 822 of the lower mating tongue 822 to commonly form the mating tongue 513.

In another embodiment, as shown in FIGS. 27-35, the plug connector 110 only partially shows the insulative housing 112 enclosed in the metallic shell 114 with a mating slot 116 and two rows of contacts 118 by two sides of the mating slot 116. Different from the plug connector 10 of the first embodiment, the plug connector 110 defines a pair of chamfered structures 120 at two lower corners. Correspondingly, the receptacle connector 150 includes a terminal module assembly 152 enclosed in a shell 154 wherein the terminal module assembly includes an upper terminal module 156 and a lower terminal module 158 stacked and assembled with each other. A plurality of upper contacts 160 are insert molded within an upper insulator 162 to form the upper terminal module 156, and a plurality of lower contacts 164 are insert molded within a lower insulator 166 to form the lower terminal module 158, wherein compared with the lower insulator 166, the upper insulator 162 further includes a mating tongue 168 on which both contacting sections 170 of the upper contacts 160 and those of the lower contacts 164 are seated on opposite surfaces thereof. The shell 154 defines a receiving cavity 172 into which the mating tongue 168 forwardly extends, and a pair of chamfered structure 172 in compliance with the chamfered structures 120 of the plug connector 110. Understandably, the plug connector 110 is mated within the receptacle connector 150 in a single orientation only due to those chamfered structures 120 and 172.

Referring to FIGS. 36-39 which are derived from the provisional application 61/949,232 and also disclosed in the copending application Ser. No. 14/454,737, the metallic shielding plate 602 of the terminal module assembly 604 of the receptacle connector 600 is mechanically and electrically connected with the metallic latch 612 of the plug connector 610 wherein the terminal module assembly includes the upper part having the upper insulator with the upper contacts, the lower part having the lower insulator with the lower contacts, and the middle part sandwiched between the upper part and the lower part and having the middle insulator enclosing the shielding plate 602.

However, the disclosure is illustrative only, changes may be made in detail, especially in matter of shape, size, and arrangement of parts within the principles of the invention.

What is claimed is:

1. An electrical connector assembly comprising:
   a first electrical connector for mounting to a printed circuit board, including:
   a terminal module assembly defined by an upper terminal module and a lower terminal module commonly sandwiching a mating tongue in a vertical direction; the upper terminal module including an upper insulator equipped with a plurality of upper contacts with corresponding contacting sections exposed upon one surface of the mating tongue; and
   the lower terminal module including a lower insulator equipped with a plurality of lower contacts with corresponding contacting sections exposed upon the other surface of the mating tongue; and
   a metallic shielding plate embedded within the mating tongue; wherein said shielding plate defines protruding edges encompassing at least partially a boundary of the mating tongue for protection under an improper angular mating of a second connector; wherein
   said shielding plate defines a spring tang mechanically and electrically connected to a metallic shell enclosing the terminal module assembly.

2. The electrical connector assembly as claimed in claim 1, wherein the shielding plate includes at least one retaining rib extending downwardly into the lower terminal module.

3. The electrical connector assembly as claimed in claim 1, wherein the lower insulator forms a protrusion received within an opening of the shielding plate to align the lower terminal module and the mating tongue with each other in the vertical direction.

4. The electrical connector assembly as claimed in claim 1, wherein the lower insulator includes a mounting post for mounting to the printed circuit board.

5. The electrical connector assembly as claimed in claim 1, wherein the terminal module assembly is received in a metallic shell which defines a mating port with only one mating orientation.

6. The electrical connector assembly as claimed in claim 1, wherein tails of the lower contacts are of a through type while tails of the upper contacts are of a surface mount type.

7. The electrical connector assembly as claimed in claim 1, wherein said metallic shell includes a rear wall abutting against a rear side of the terminal module assembly and locked to opposite side regions of the shell.

8. The electrical connector assembly as claimed in claim 7, wherein the rear wall further includes mounting legs for mounting to said printed circuit board.

9. The electrical connector assembly as claimed in claim 8, wherein the shielding plate defines a pair of locking notches exposed outside of opposite lateral sides of the mating tongue for locking to a plug connector.

10. The electrical connector assembly as claimed in claim 9, wherein said second connector includes an insulative housing with therein a receiving cavity to receive said mating tongue therein, and a pair of laterally deflectable latch arms extending into the receiving cavity to lock with the locking notches, respectively.

11. The electrical connector assembly as claimed in claim 9, wherein said mating tongue forms a pair of notches in opposite lateral sides of the mating tongue in compliance with the locking notches, respectively, in the vertical direction.

12. An electrical connector for mounted on a printed circuit board, comprising:
    a terminal module assembly defined by an upper terminal module and a lower terminal module commonly intimately sandwiching a shielding plate therebetween in a vertical direction; the upper terminal module including an upper insulator equipped with a plurality of upper contacts with corresponding contacting sections extending from a front face thereof; and
    the lower terminal module including a lower insulator equipped with a plurality of lower contacts with corresponding contacting sections extending from a front face thereof; wherein the upper insulator and the lower insulator commonly form a mating tongue for mating with a second connector, and the shielding plate defines a pair of locking notches on two opposite lateral sides, respectively, for locking to said second connector; wherein
    the shielding plate defines a spring tang mechanically and electrically connected to a metallic shell enclosing the terminal module assembly.

13. The electrical connector assembly as claimed in claim 12, wherein said second connector includes an insulative housing with therein a receiving cavity to receive said mating tongue therein, and a pair of laterally deflectable latch arms extending into the receiving cavity to lock with the locking notches, respectively.

14. The electrical connector assembly as claimed in claim 12, wherein the shielding plate includes at least one retaining rib extending downwardly into the lower terminal module.

15. The electrical connector assembly as claimed in claim 12, wherein said metallic shell includes a rear wall abutting against a rear side of the terminal module assembly and locked to opposite side regions of the shell.

16. The electrical connector assembly as claimed in claim 15, wherein the rear wall further includes mounting legs for mounting to said printed circuit board.

17. An electrical connector assembly comprising:
    a first connector for mounting to a printed circuit board, including:
    a terminal module assembly defined by an upper terminal module and a lower terminal module commonly sandwiching a mating tongue in a vertical direction;
    the upper terminal module including an upper insulator equipped with a plurality of upper contacts with corresponding contacting sections exposed upon one surface of the mating tongue; and the lower terminal module including a lower insulator equipped with a plurality of lower contacts with corresponding contacting sections exposed upon the other surface of the mating tongue; and a metallic shielding plate embedded within the mating tongue; wherein said shielding plate defines a front edge flush with a front edge of the mating tongue for protection under an improper angular mating of a plug connector; wherein
the front edge of the shielding plate forms a plurality of notches filled with material of the mating tongue.

\* \* \* \* \*